(12) United States Patent
Matsumura et al.

(10) Patent No.: US 8,716,719 B2
(45) Date of Patent: May 6, 2014

(54) SOLID-STATE IMAGING DEVICE, METHOD OF MANUFACTURING SOLID-STATE IMAGING DEVICE, AND ELECTRONIC APPARATUS

(75) Inventors: Yusuke Matsumura, Kanagawa (JP); Takashi Machida, Kanagawa (JP)

(73) Assignee: Sony Corporation, Tokyo (JP)

( * ) Notice: Subject to any disclaimer, the term of this patent is extended or adjusted under 35 U.S.C. 154(b) by 73 days.

(21) Appl. No.: 13/078,569

(22) Filed: Apr. 1, 2011

(65) Prior Publication Data

US 2011/0248371 A1 Oct. 13, 2011

(30) Foreign Application Priority Data

Apr. 8, 2010 (JP) ................................. 2010-089606

(51) Int. Cl.
*H01L 31/0232* (2006.01)
(52) U.S. Cl.
USPC ............. 257/80; 257/462; 257/293; 257/414; 438/60; 438/75; 438/144
(58) Field of Classification Search
USPC .......................................................... 257/80
See application file for complete search history.

(56) References Cited

U.S. PATENT DOCUMENTS

| 7,115,924 | B1* | 10/2006 | LaMaster et al. ............. 257/291 |
|---|---|---|---|
| 8,218,042 | B2 | 7/2012 | Miyatake et al. |
| 2005/0280054 | A1 | 12/2005 | Park et al. |
| 2006/0065915 | A1 | 3/2006 | Kuwazawa |
| 2007/0045665 | A1 | 3/2007 | Park |
| 2008/0179642 | A1 | 7/2008 | Lee et al. |
| 2009/0072337 | A1* | 3/2009 | Lee ............................... 257/440 |
| 2009/0251582 | A1 | 10/2009 | Oike |

FOREIGN PATENT DOCUMENTS

| JP | 60-124180 | 7/1985 |
|---|---|---|
| JP | 63-142858 | 6/1988 |
| JP | 05-268526 | 10/1993 |
| JP | 08-213582 | 8/1996 |
| JP | 2005-183922 | 7/2005 |
| JP | 2006-261532 | 9/2006 |
| JP | 2008-004692 | 1/2008 |
| JP | 2009-268083 | 11/2011 |

OTHER PUBLICATIONS

Japanese Office Action issued in connection with related Japanese Patent Application No. 2010-089606 dated Jan. 30, 2014.

* cited by examiner

*Primary Examiner* — Julio J Maldonado
*Assistant Examiner* — Mohammad Choudhry
(74) *Attorney, Agent, or Firm* — Dentons US LLP

(57) ABSTRACT

Provided is a solid-state imaging device including: a first-conductivity-type substrate; a second-conductivity-type well formed in a surface side of the first-conductivity-type substrate; a photoelectric conversion area configured with a first-conductivity-type-impurity area formed in the second-conductivity-type well to convert incident light to charges; a first-conductivity-type-charge retaining area configured with the first-conductivity-type-impurity area formed in the second-conductivity-type well to retain the charges converted by the photoelectric conversion area until the charges are read out; a charge voltage conversion area configured with the first-conductivity-type-impurity area formed in the second-conductivity-type well to convert the charges retained in the charge retaining area to a voltage; and a first-conductivity-type-layer area configured by forming a first-conductivity-type-in a convex shape from a boundary between the first-conductivity-type substrate and the second-conductivity-type well to a predetermined depth of the surface side under at least one portion of the charge retaining area and the charge voltage conversion area.

4 Claims, 17 Drawing Sheets

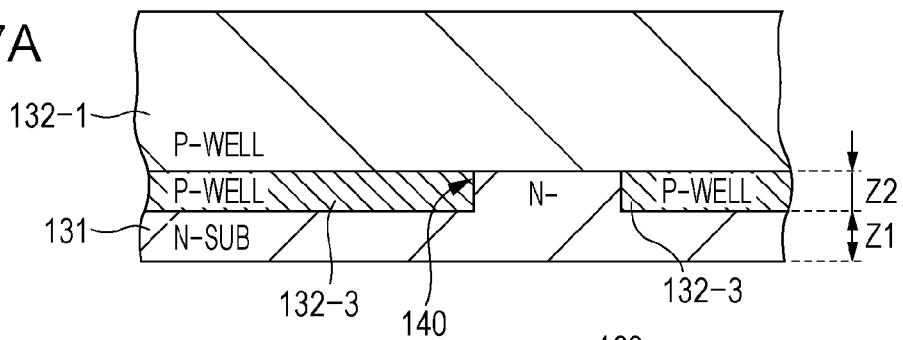
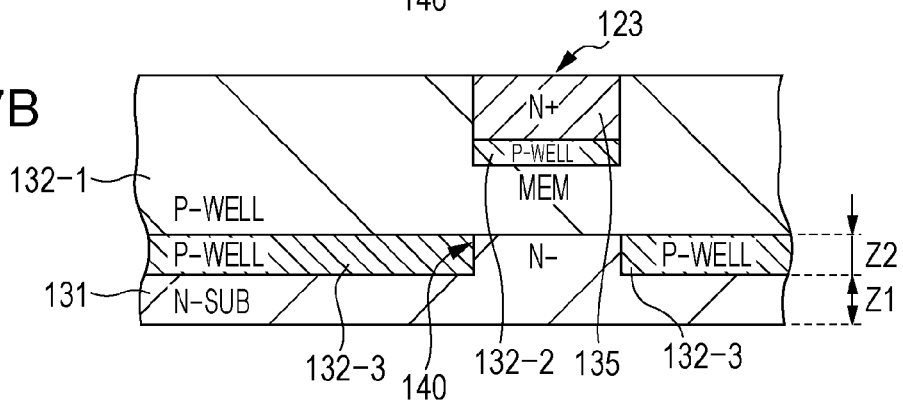
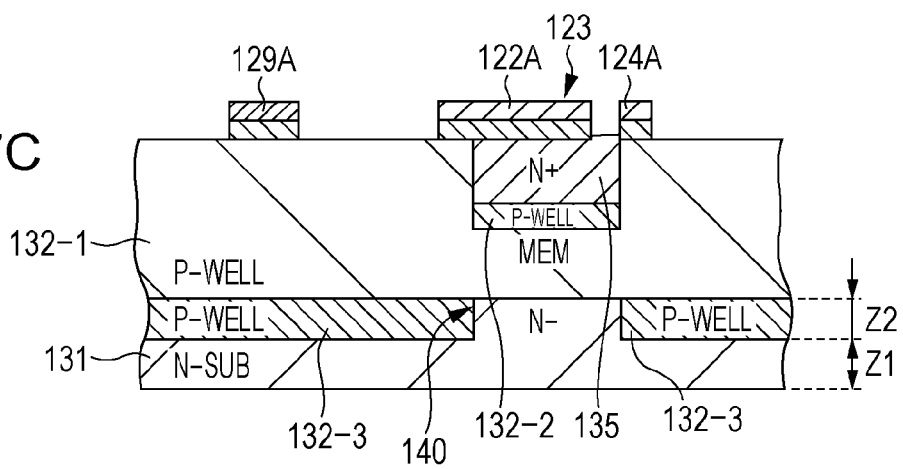
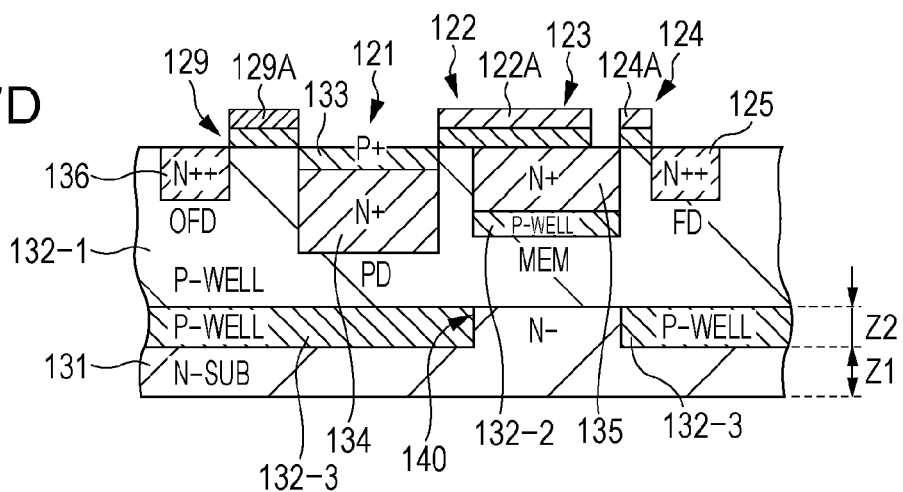

SOLID-STATE IMAGING DEVICE, METHOD OF MANUFACTURING SOLID-STATE IMAGING DEVICE, AND ELECTRONIC APPARATUS

BACKGROUND OF THE INVENTION

1. Field of the Invention

The invention relates to a solid-state imaging device, a method of manufacturing the solid-state imaging device, and an electronic apparatus, and more particularly to, a solid-state imaging device capable of more effectively suppressing noise, a method of manufacturing the solid-state imaging device, and an electronic apparatus.

2. Description of the Related Art

Recently, in a video camera or an electronic still camera, a CCD (Charge Coupled Device) or a CMOS (Complementary Metal Oxide Semiconductor) image sensor is used as a solid-state imaging device for capturing an image. Particularly, in comparison with the CCD, the CMOS image sensor has excellent characteristics in terms of low power consumption.

In the related art, each pixel included in the CMOS image sensor is configured to include, for example, a photodiode, a transfer gate, a floating diffusion, a reset transistor, an amplification transistor, and a selection transistor. In addition, in each pixel, a read operation of reading out the signal charges, which are generated by the photodiode as the photoelectric conversion unit to be accumulated and transferred to the floating diffusion, through the amplification transistor is performed.

However, in the CMOS image sensor, since the read operation is performed for each row of the pixel array, the accumulation periods of the signal charges in all the pixels are not coincident with each other, and in the case were a subject is moved, distortion occurs in a captured image. For example, in the case of photographing an object, which is moving in the horizontal direction, straight in the up/down directions, the object is projected to be slanted.

In order to prevent occurrence of distortion in an image, an all-pixels simultaneous electronic shutter for the CMOS image sensor, in the exposure periods of the pixels are coincident with each other, has been developed. The all-pixels simultaneous electronic shutter is a shutter performing operations of simultaneously starting exposure of all the pixels effective for imaging and simultaneously ending exposure, which is also referred to as a global shutter (global exposure).

As a method of implementing the global shutter in the CMOS image sensor, there is, for example, a method of providing a memory portion between a photodiode and a floating diffusion for each pixel. In the CMOS image sensor having the pixels including the memory portion, for example, after exposure is simultaneously performed on the all pixels, the signal charges generated in the photodiodes are simultaneously transferred to the memory portions of the all pixels and temporarily accumulated in the memory portions. Next, the signal charges accumulated in the memory portions are transferred to the floating diffusions at a predetermined read timing to be converted into a voltage as an output.

However, for example, in the case where light is incident from an opening, through which light incident to the photodiode, toward an lower portion of the memory portion in a slanted direction, a portion of the charges generated in a relatively deep area under the memory portion through the photoelectric conversion may not be introduced into the photodiode but flowed into the memory portion. The charges flowed into the memory portion in this manner are read out similarly to the signal charges transferred from the photodiode. In this manner, the charges which are not transferred from the photodiode function as noise. Hereinafter, the output generated when the charges generated in the relatively deep area under the memory portion through the photoelectric conversion are flowed into the memory portion is referred to as noise.

In addition, generally, due to the existence of the P type well located in the deepest portion among the P type wells formed through multiple-stage injecting, a weak electric field area is formed between the junction position of the memory portion and the P type well located in the deepest portion. Therefore, the electrons generated in the weak electric field area through the photoelectric conversion are diffused toward the side of the memory portion with high probability, so that the noise is increased.

In order to suppress an increase in noise, a solid-state imaging device having a pixel structure where a P type layer is disposed through a portion of a P type well under an N type memory portion (charge storage unit) so that an impurity concentration of the P type layer is set to be higher than an impurity concentration of the P type well has been disclosed (refer to, for example, Japanese Unexamined Patent Application Publication No. 2008-4692).

SUMMARY OF THE INVENTION

However, in the aforementioned structure of the solid-state imaging device disclosed in Japanese Unexamined Patent Application Publication No. 2008-4692, the charges generated in the P type well between the memory portion and the P type layer through the photoelectric conversion may be flowed into the memory portion. Therefore, the charges function as the noise, so that it is necessary to provide a pixel structure of more effectively suppressing the noise.

It is desirable to more effectively suppress noise.

According to a first embodiment of the invention, there is provided a solid-state imaging device including: a first conductivity type substrate; a second conductivity type well which is formed in a surface side of the first conductivity type substrate; a photoelectric conversion area which is configured with a first conductivity type impurity area formed in the second conductivity type well to convert incident light to charges; a first conductivity type charge retaining area which is configured with the first conductivity type impurity area formed in the second conductivity type well to retain the charges converted by the photoelectric conversion area until the charges are read out; a charge voltage conversion area which is configured with the first conductivity type impurity area formed in the second conductivity type well to convert the charges retained in the charge retaining area to a voltage; and a first conductivity type layer area which is configured by forming a first conductivity type in a convex shape from a boundary between the first conductivity type substrate and the second conductivity type well to a predetermined depth of the surface side under at least one portion of the charge retaining area and the charge voltage conversion area.

According to a second embodiment of the invention, there is provided a method of manufacturing a solid-state imaging device, including the steps of: forming a second conductivity type well in a surface side of the first conductivity type substrate; forming a photoelectric conversion area, which is configured with a first conductivity type impurity area formed in the second conductivity type well to convert incident light to charges, by performing ion injection; forming a first conductivity type charge retaining area, which is configured with the first conductivity type impurity area formed in the second conductivity type well to retain the charges converted by the photoelectric conversion area until the charges are read out, by performing ion injection; and forming a charge voltage conversion area, which is configured with the first conductivity type impurity area formed in the second conductivity type well to convert the charges retained in the charge retaining area to a voltage, by performing ion injection, wherein, when the second conductivity type well is formed, a first conductivity type layer area which is configured by forming a first conductivity type in a convex shape from a boundary between the first conductivity type substrate and the second conductivity type well to a predetermined depth of the surface side is provided by forming the second conductivity type well disposed in the lowermost layer in an area other than the area under at least one portion of the charge retaining area and the charge voltage conversion area.

According to a third embodiment of the invention, there is provided an electronic apparatus having a solid-state imaging device, wherein the solid-state imaging device includes: a first conductivity type substrate; a second conductivity type well which is formed in a surface side of the first conductivity type substrate; a photoelectric conversion area which is configured with a first conductivity type impurity area formed in the second conductivity type well to convert incident light to charges; a first conductivity type charge retaining area which is configured with the first conductivity type impurity area formed in the second conductivity type well to retain the charges converted by the photoelectric conversion area until the charges are read out; a charge voltage conversion area which is configured with the first conductivity type impurity area formed in the second conductivity type well to convert the charges retained in the charge retaining area to a voltage; and a first conductivity type layer area which is configured by forming a first conductivity type in a convex shape from a boundary between the first conductivity type substrate and the second conductivity type well to a predetermined depth of the surface side under at least one portion of the charge retaining area and the charge voltage conversion area, wherein the charge accumulation is simultaneously performed at unit pixels of a plurality of rows disposed in a matrix shape, and wherein the charges transferred by a transfer gate, which transfers the charges from the photoelectric conversion area to the charge retaining area, are sequentially read out.

According to a fourth embodiment of the invention, there is provided a solid-state imaging device including: a first conductivity type substrate; a second conductivity type well which is formed in a surface side of the first conductivity type substrate; a photoelectric conversion area which is configured with a first conductivity type impurity area formed in the second conductivity type well to convert incident light to charges; a charge voltage conversion area which is configured with the first conductivity type impurity area formed in the second conductivity type well to convert the charges converted by the photoelectric conversion area to a voltage; and a first conductivity type layer area which is configured by forming a first conductivity type in a convex shape from a boundary between the first conductivity type substrate and the second conductivity type well to a predetermined depth of the surface side under at least a portion of the charge voltage conversion area.

According to a fifth embodiment of the invention, there is provided a method of manufacturing a solid-state imaging device, including the steps of: forming a second conductivity type well in a surface side of the first conductivity type substrate; forming a photoelectric conversion area, which is configured with a first conductivity type impurity area formed in the second conductivity type well to convert incident light to charges, by performing ion injection; and forming a charge voltage conversion area, which is configured with the first conductivity type impurity area formed in the second conductivity type well to convert the charges converted by the photoelectric conversion area to a voltage, by performing ion injection, wherein, when the second conductivity type well is formed, a first conductivity type layer area which is configured by forming a first conductivity type in a convex shape from a boundary between the first conductivity type substrate and the second conductivity type well to a predetermined depth of the surface side is provided by forming the second conductivity type well disposed in the lowermost layer in an area other than the area under at least a portion of the charge voltage conversion area.

According to a sixth embodiment of the invention, there is provided an electronic apparatus having a solid-state imaging device, wherein the solid-state imaging device includes: a first conductivity type substrate; a second conductivity type well which is formed in a surface side of the first conductivity type substrate; a photoelectric conversion area which is configured with a first conductivity type impurity area formed in the second conductivity type well to convert incident light to charges; a charge voltage conversion area which is configured with the first conductivity type impurity area formed in the second conductivity type well to convert the charges converted by the photoelectric conversion area to a voltage; and a first conductivity type layer area which is configured by forming a first conductivity type in a convex shape from a boundary between the first conductivity type substrate and the second conductivity type well to a predetermined depth of the surface side under at least a portion of the charge voltage conversion area, wherein the charge accumulation is simultaneously performed at unit pixels of a plurality of rows disposed in a matrix shape, and wherein the charges transferred by a transfer gate, which transfers the charges from the photoelectric conversion area to the charge voltage conversion area, are sequentially read out.

According to a seventh embodiment of the invention, there is provided a solid-state imaging device including: a first conductivity type substrate; a second conductivity type well which is formed in a surface side of the first conductivity type substrate; a photoelectric conversion area which is configured with a first conductivity type impurity area formed in the second conductivity type well to convert incident light to charges; a first transfer unit which is configured with a first conductivity type impurity area formed in the second conductivity type well to temporarily read out and transfer the charges converted by the photoelectric conversion area; a second transfer unit which is configured with a first conductivity type impurity area formed in the second conductivity type well to transfer the charges transferred by the first transfer unit to a charge voltage conversion unit which converts the charges to a voltage; and a first conductivity type layer area which is configured by forming a first conductivity type in a convex shape from a boundary between the first conductivity type substrate and the second conductivity type well to a predetermined depth of the surface side under at least one portion of the first transfer unit and the second transfer unit.

According to an eighth embodiment of the invention, there is provided a method of manufacturing a solid-state imaging device, including the steps of: forming a second conductivity type well in a surface side of the first conductivity type substrate; forming a photoelectric conversion area, which is configured with a first conductivity type impurity area formed in the second conductivity type well to convert incident light to charges, by performing ion injection; forming a first transfer unit, which is configured with a first conductivity type impurity area formed in the second conductivity type well to temporarily read out and transfer the charges converted by the photoelectric conversion area, by performing ion injection; and forming a second transfer unit, which is configured with a first conductivity type impurity area formed in the second conductivity type well to transfer the charges transferred by the first transfer unit to a charge voltage conversion unit which converts the charges to a voltage, by performing ion injection, wherein, when the second conductivity type well is formed, a first conductivity type layer area which is configured by forming a first conductivity type in a convex shape from a boundary between the first conductivity type substrate and the second conductivity type well to a predetermined depth of the surface side is provided by forming the second conductivity type well in the lowermost layer in an area other than an area under at least one portion of the first transfer unit and the second transfer unit.

According to a ninth embodiment of the invention, there is provided an electronic apparatus having a solid-state imaging device, wherein the solid-state imaging device includes: a first conductivity type substrate; a second conductivity type well which is formed in a surface side of the first conductivity type substrate; a photoelectric conversion area which is configured with a first conductivity type impurity area formed in the second conductivity type well to convert incident light to charges; a first transfer unit which is configured with a first conductivity type impurity area formed in the second conductivity type well to temporarily read out and transfer the charges converted by the photoelectric conversion area; a second transfer unit which is configured with a first conductivity type impurity area formed in the second conductivity type well to transfer the charges transferred by the first transfer unit to a charge voltage conversion unit which converts the charges to a voltage; and a first conductivity type layer area which is configured by forming a first conductivity type in a convex shape from a boundary between the first conductivity type substrate and the second conductivity type well to a predetermined depth of the surface side under at least one portion of the first transfer unit and the second transfer unit, wherein the charge accumulation is simultaneously performed at unit pixels of a plurality of rows disposed in a matrix shape, and wherein the charges transferred by a first transfer gate are sequentially read out.

According to the first to ninth embodiments of the invention, the first conductivity type layer area, where the first conductivity type is formed in a convex shape from the boundary between the first conductivity type substrate and the second conductivity type well to a predetermined depth of the surface side, is disposed.

According to the first to ninth embodiments of the invention, it is possible to more effectively suppress noise.

BRIEF DESCRIPTION OF THE DRAWINGS

FIGS. 7A to 7D are diagrams illustrating a process of manufacturing a unit pixel.

DESCRIPTION OF THE PREFERRED EMBODIMENTS

Hereinafter, specific embodiments of the invention will be described in detail with reference to the drawings.

Figure 1:
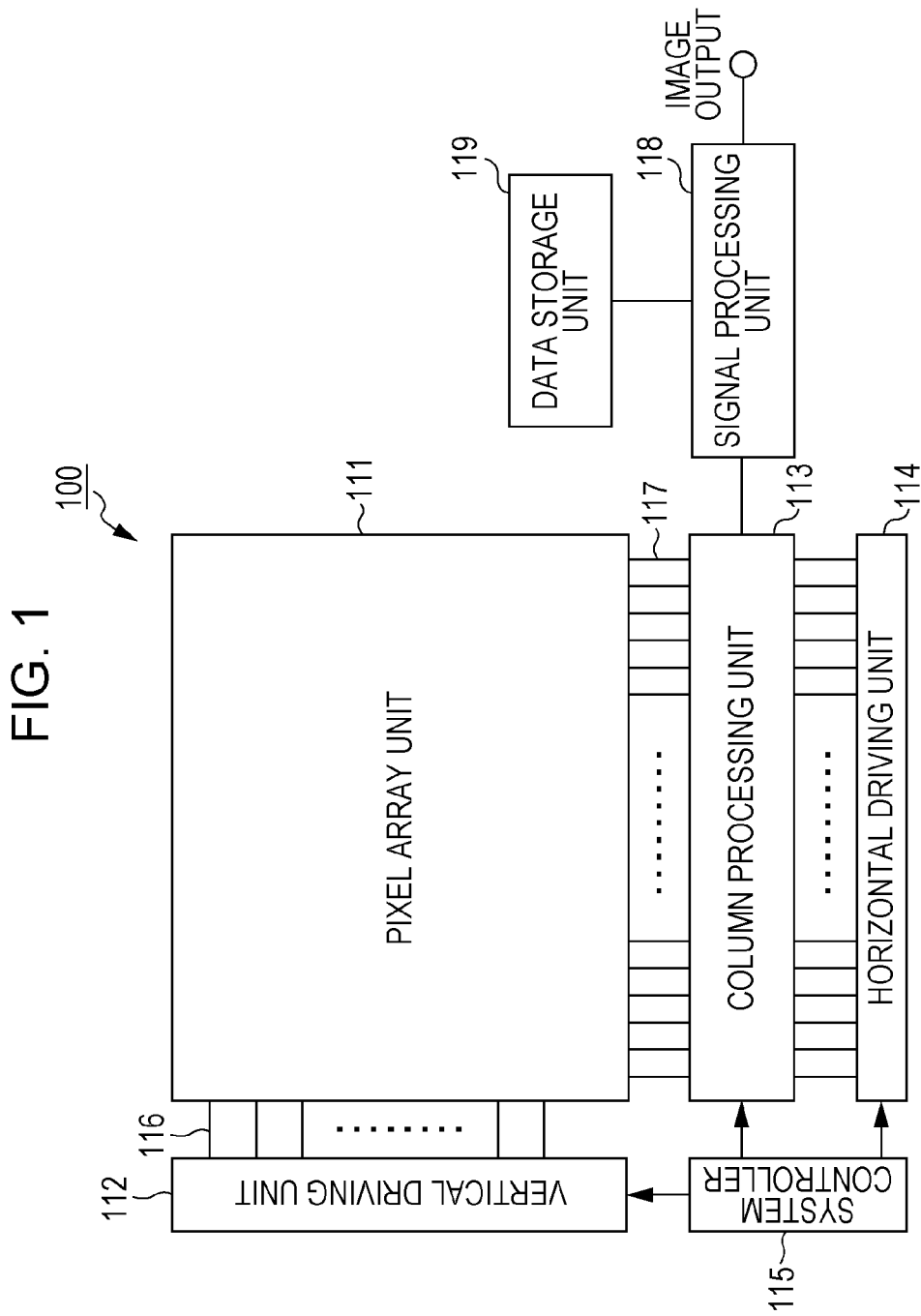
FIG. 1 is a block diagram illustrating an example of a configuration of a solid-state imaging device according to an embodiment of the invention.

FIG. 1 is a block diagram illustrating an example of a configuration of a solid-state imaging device according to an embodiment of the invention.

[Example of Configuration of Solid-State Imaging Device]

FIG. 1 is a block diagram illustrating an example of a configuration of a CMOS image sensor as a solid-state imaging device according to an embodiment of the invention.

The CMOS image sensor 100 is configured to include a pixel array unit 111, a vertical driving unit 112, a column processing unit 113, a horizontal driving unit 114, and a system controller 115. The pixel array unit 111, the vertical driving unit 112, the column processing unit 113, the horizontal driving unit 114, and the system controller 115 are formed on a semiconductor substrate (chip) (not shown).

In the pixel array unit 111, unit pixels (unit pixels 120 of FIG. 2) having photoelectric conversion elements, which generate photoelectric charges having charge amounts according to the incident light amount and accumulate the photoelectric charges therein, are arrayed two-dimensionally in a matrix shape. In addition, hereinafter, the photoelectric charges having charge amounts according to the incident light amount may be simply referred to as "charges", and the unit pixel may be simply referred to as "pixels".

In addition, in the pixel array unit 111, a pixel driving line 116 for each row in the matrix-shaped pixel array is formed in the left/right direction of the figure (the array direction of the pixels in the pixel row), and a vertical signal line 117 for each column is formed in the up/down direction of the figure (the array direction of the pixels in the pixel column). In FIG. 1, one pixel driving line 116 is illustrated, but the invention is not limited to one. The one end of the pixel driving line 116 is connected to an output terminal of the vertical driving unit 112 corresponding to each row.

The CMOS image sensor 100 further includes a signal processing unit 118 and a data storage unit 119. The signal processing unit 118 and the data storage unit 119 may be implemented as an external signal processing unit, for example, a DSP (Digital Signal Processor) provided in a substrate different from that of the CMOS image sensor 100 or as a software process. Otherwise, the signal processing unit 118 and the data storage unit 119 may be mounted on the same substrate as the CMOS image sensor 100.

The vertical driving unit 112 is a pixel driving unit which is configured with shift registers, address decoders, and the like to simultaneously drive the all pixels of the pixel array unit 111 or to drive the pixels in unit of a row or the like. Although the detailed configuration of the vertical driving unit 112 is not illustrated, the vertical driving unit 112 is generally configured to have two scan systems of a reading scan system and an erasing scan system.

In order to read out signals from the unit pixel, the reading scan system performs selective scan on the unit pixel of the pixel array unit 111 sequentially in unit of a row. The erasing scan system performs erasing scan on the read row, which is subject to the reading scan of the reading scan system, by a time of a shutter speed prior to the reading scan.

By the erasing scan of the erasing scan system, unnecessary charges are erased (reset) from the photoelectric conversion elements of the unit pixels in the read row. Next, after the unnecessary charges are erased (reset) by the erasing scan system, a so-called electronic shutter operation is performed. Herein, the electronic shutter operation denotes an operation of discarding the photoelectric charges of the photoelectric conversion element and starting new exposure (starting photoelectric charge accumulation)

The signal read out by the read operation of the reading scan system corresponds to the light amount incident after the just-before read operation or the electronic shutter operation. In addition, the time interval from the read timing of the just-before read operation or the erase timing of the electronic shutter operation to the read timing of the current read operation becomes the photoelectric charge accumulation time (exposure time) of the unit pixel.

The pixel signal output from each unit pixel in the pixel row selectively scanned by the vertical driving unit 112 is supplied through each of the vertical signal lines 117 to the column processing unit 113. The column processing unit 113 performs a predetermined signal process on the pixel signal output through the vertical signal line 117 from each unit pixel in the selected row for each pixel column of the pixel array unit 111 and temporarily retains the signal-processed pixel signal.

More specifically, the column processing unit 113 performs at least a noise removing process, for example, a CDS (Correlated Double Sampling) process as the signal process. Fixed pattern noise intrinsic to the pixel such as reset noise variation in threshold value of an amplification transistor is removed by the CDS process of the column processing unit 113. Besides the noise removing process, the column processing unit 113 may be provided with, for example, an AD (analog-digital) conversion function so as to output the signal level as a digital signal.

The horizontal driving unit 114 is configured with shift registers, address decoders, or the like to sequentially select unit circuits of the column processing unit 113 corresponding to the pixel column. The pixel signals, which are subject to a signal process of the column processing unit 113, are sequentially output to the signal processing unit 118 through the selection scan of the horizontal driving unit 114.

The system controller 115 is configured with a timing generator or the like, which generates various timing signals, to perform driving control of the vertical driving unit 112, the column processing unit 113, the horizontal driving unit 114, and the like based on various timing signals generated by the timing generator.

The signal processing unit 118 has at least an addition process function to perform various signal processes such as an addition process on the pixel signal output from the column processing unit 113. At the time of the signal process of the signal processing unit 118, the data storage unit 119 temporarily stores data necessary for the process.

[Structure of Unit Pixel]

Next, a detailed structure of the unit pixel 120 arrayed in a matrix shape in the pixel array unit 111 will be described. The unit pixel 120 includes a charge retaining area (hereinafter, a "memory portion"), which retains the photoelectric charges transferred from the photoelectric conversion element, in addition to the floating diffusion area (capacitance).

Figure 2:
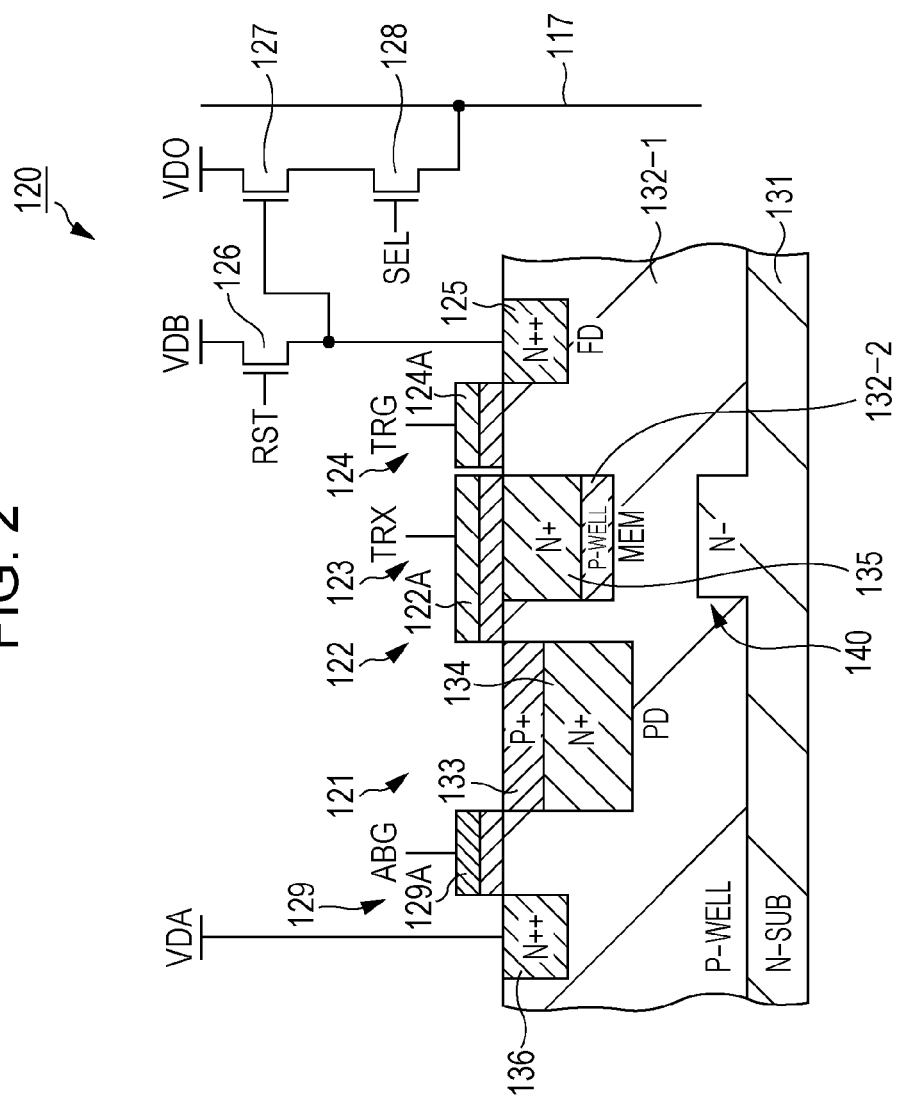
FIG. 2 is a diagram illustrating a configuration of a unit pixel.

FIG. 2 is a diagram illustrating a configuration of the unit pixel 120.

The unit pixel 120 includes, for example, a photodiode (PD) 121 as a photoelectric conversion element. The photodiode 121 is a buried type photodiode which is formed, for example, by forming a P type layer 133 (P+) in a substrate surface side in a first P type well layer 132-1 formed in a N type substrate 131 and burying an N type buried layer 134 (N+). In the embodiment, the N type is defined by the first conductivity type, and the P type is defined by the second conductivity type. In addition, in the embodiment, the N type impurity concentration is increased in the order of N−, N, N+, and N++, and similarly, the P type impurity concentration is increased in the order of P and P+.

In addition to the photodiode 121, the unit pixel 120 includes a first transfer gate 122, a memory portion (MEM) 123, a second transfer gate 124, and a floating diffusion area (FD) 125.

The first transfer gate 122 transfers the charges, which are photo-electrically converted by the photodiode 121 and accumulated therein, according to application of a transfer pulse TRX to a gate electrode 122A. The memory portion 123 is formed by an N type buried channel 135 (N+), which is formed under the gate electrode 122A, to retain the charges transferred from the photodiode 121 by the first transfer gate 122. Since the memory portion 123 is formed by the buried channel 135, the occurrence of dark current at the boundary surface of the substrate is suppressed, so that it is possible to improve image quality.

The gate electrode 122A is disposed in the upper portion of the memory portion 123, and a transfer pulse TRX is applied to the gate electrode 122A, so that the memory portion 123 can be modulated. In other words, through application of the transfer pulse TRX to the gate electrode 122A, a potential of the memory portion 123 becomes deeper. Therefore, a saturated charge amount of the memory portion 123 can be increased in comparison where the memory unit 123 is not modulated.

The second transfer gate 124 transfers the charges retained in the memory portion 123 through application of the transfer pulse TRG to the gate electrode 124A. A floating diffusion area 125 is a charge voltage conversion portion which is constructed with an N type layer (N++) to convert the charges, which are transferred from the memory portion 123 by the second transfer gate 124, to a voltage.

The unit pixel 120 further includes a reset transistor 126, an amplification transistor 127, and a selection transistor 128. In the example of FIG. 2, the reset transistor 126, the amplification transistor 127, and the selection transistor 128 are configured by using an N channel MOS transistor. However, the combination of the conductivity types of the reset transistor 126, the amplification transistor 127, and the selection transistor 128 exemplified in FIG. 2 is an example, but the invention is not limited to the combination.

The reset transistor 126 is connected between a power source VDB and the floating diffusion area 125 to reset the floating diffusion area 125 through application of a reset pulse RST to the gate electrode. The amplification transistor 127 is configured so that the drain electrode is connected to the power source VDO and the gate electrode is connected to the floating diffusion area 125. Therefore, the amplification transistor 127 reads out the voltage of the floating diffusion area 125.

The selection transistor 128 is configured, for example, so that the drain electrode is connected to the source electrode of the amplification transistor 127 and the source electrode is connected to the vertical signal line 117. The selection transistor 128 selects the unit pixel 120, from which the pixel signal is read out, through application of a selection pulse SEL to the gate electrode. In addition, the selection transistor 128 may be configured so that the selection transistor 128 is connected between the power source VDO and the drain electrode of the amplification transistor 127.

Among the reset transistor 126, the amplification transistor 127, and the selection transistor 128, one or more may be omitted according to a method of reading out the pixel signal, or one or more may be shared by a plurality of pixels.

The unit pixel 120 further includes a charge discharging portion 129 for discharging the accumulated charges of the photodiode 121. The charge discharging portion 129 discharges the charges the photodiode 121 to a drain portion 136 (N++) of the N type layer through application of a control pulse ABG to a gate electrode 129A at the time of the start of the exposure. The charge discharging portion 129 has a function of preventing overflow of the charges due to saturation of the photodiode 121 during the read period after the end of the exposure. A predetermined voltage VDA is applied to the drain portion 136.

In addition, in the unit pixel 120, a second P type well layer 132-2 is formed just under the memory portion 123, and a low concentration N type layer area 140 (N−) is formed in a portion of a deep area under the memory portion 123 so that a portion of the N type substrate 131 protrudes upwards. The second P type well layer 132-2 and the low concentration N type layer area 140 will be described later with reference to FIG. 3 and FIGS. 4A and 4B.

[Potential of Gate Electrode of Memory Portion 123]

Herein, the potential of the gate electrode of the memory portion 123 as the charge retaining area, that is, the gate electrode 122A of the first transfer gate 122 will be described.

In the embodiment, the potential of the gate electrode of the memory portion 123 as the charge retaining area is set to the pinning-state potential in the period when at least one of the first transfer gate 122 and the second transfer gate 124, for example, the first transfer gate 122 is allowed to be in a non-conductive state. More specifically, when one or both of the first transfer gate 122 and the second transfer gate 124 is allowed to be in the non-conductive state, the voltage applied to the gate electrodes 122A and 124A is set to the pinning-state voltage in which carriers may be accumulated in the Si surface just under the gate electrode.

Similarly to the embodiment, in the case where the transistor where the transfer gate is formed is of the N type, when the first transfer gate 122 is allowed to be in the non-conductive state, the voltage applied to the gate electrode 122A is set to the voltage which is a negative potential lower than the ground GND with respect to the first P type well layer 132-1. In addition, although not shown, in the case where the transistor where the transfer gate is formed is of the P type, the P type well layer becomes the N type well layer, the voltage applied to the gate electrode 122A is set to a voltage higher than the power source voltage VDD with respect to the N type well layer.

When the first transfer gate 122 is allowed to be in the non-conductive state, the voltage applied to the gate electrode 122A is set to the pinning-state voltage in which carriers may be accumulated in the Si surface just under the gate electrode due to the following reasons.

If the potential of the gate electrode 122A of the first transfer gate 122 is set to the same potential (for example, 0V) as that of the first P type well layer 132-1, the carriers generated due to crystal defects of the Si surface are accumulated in the memory portion 123, so that image quality may be deteriorated by the dark current. Therefore, in the embodiment, the OFF potential of the gate electrode 122A formed on the memory portion 123 is set to a negative potential, for example, −2.0V with respect to the first P type well layer 132-1. Accordingly, in the embodiment, during the charge retaining period, holes are generated in the Si surface of the memory portion 123. Since the holes may be recombined with electrons generated in the Si surface, it is possible to reduce the dark current.

In addition, in the configuration of FIG. 2, since the gate electrode 124A of the second transfer gate 124 exists at the end portion of the memory portion 123, if the gate electrode 124A is also set to be a negative potential, similarly, it is possible to suppress the dark current generated at the end portion of the memory portion 123.

The CMOS image sensor 100 implements global exposure of simultaneously starting exposure of the all pixels, simultaneously ending exposure of the all pixels, and sequentially transferring the charges accumulated in the photodiode 121 to the light-shielded memory portion 123 and floating diffusion area 125. By the global exposure, it is possible to perform imaging without distortion in the exposure period which is coincident across all the pixels.

In addition, in the embodiment, the all pixels denote all the pixels of a portion appearing in an image, and thus, dummy pixels or the like are excluded. In addition, if time difference or distortion of an image is negligibly so small as not to cause a problem, instead of the all-pixels simultaneous operation, an operation of performing scan in unit of a plurality of rows (for example, several tens of rows) at high speed may also be employed. In addition, even in the case where the global exposure is performed across the pixels in multiple rows in a predetermined area instead of all the pixels in the portion appearing in the image, the invention may be employed.

Figure 3:
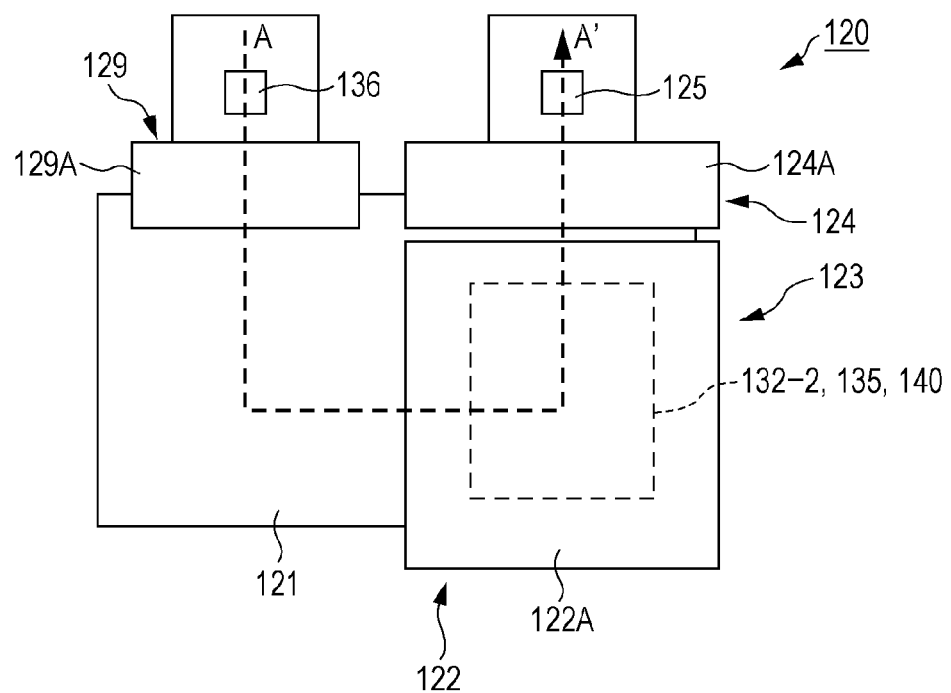
FIG. 3 is a plan diagram illustrating a first configuration of the unit pixel.

Next, FIG. 3 is a plan diagram illustrating a configuration of the unit pixel 120.

In FIG. 3, an area where the buried channel 135, the second P type well layer 132-2, and the low concentration N type layer area 140 are formed is indicated by a broken line. In other words, the buried channel 135, the second P type well layer 132-2, and the low concentration N type layer area 140 are disposed at the positions which are overlapped as seen in the plan view.

Next, a cross-sectional structure and a potential state of the unit pixel 120 are described with reference to FIGS. 4A and 4B.

Figure 4A:
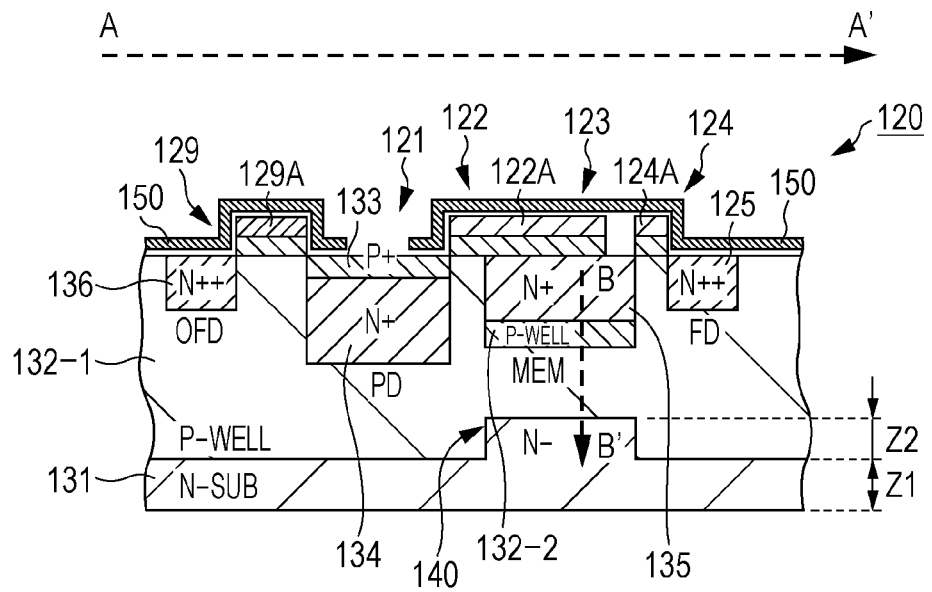
FIGS. 4A and 4B are diagrammatic cross-sectional diagram and a potential diagram of the first configuration of the unit pixel.

FIG. 4A illustrates a cross-sectional diagram of the unit pixel 120 taken along the broken-line arrow A-A' illustrated in FIG. 3. FIG. 4B illustrates a potential along the broken-line arrow B-B' illustrated in FIG. 4A.

As illustrated in FIG. 4A, the second P type well layer 132-2 is formed to be in contact with the bottom surface of the buried channel 135 constituting the memory portion 123. The low concentration N type layer area 140 is an area of which the N type impurity concentration is lower than the N type impurity concentration of the N type substrate 131. In addition, the low concentration N type layer area 140 is formed down to a position which is swallowed by a depth Z2 from the boundary between the first P type well layer 132-1 under the memory portion 123 and the N type substrate 131 in a portion of a deep area under the memory portion 123.

In addition, as illustrated in FIG. 4A, components except for openings for introducing light to the photodiode 121 are covered with a light shielding film 150. Insulating films (not shown) are formed between the light shielding film 150 and the surface of the substrate or the electrodes or the like. In addition, although not shown, the light shielding film 150 is opened at positions besides the openings, for example, positions corresponding to contacts for the gate transistor, the floating diffusion area 125, the drain portion 136, and the like.

Figure 4B:
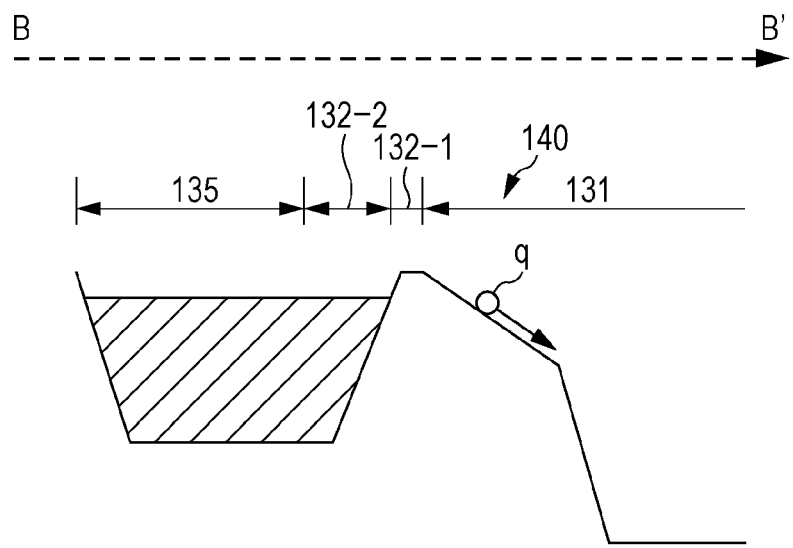

Next, as illustrated in FIG. 4B, in the unit pixel 120, the first P type well layer 132-1 and the low concentration N type layer area 140 are formed, so that the potential distribution under the memory portion 123 is changed.

In other words, as illustrated in FIG. 4B, an electric field is generated so that the potential is increased in the direction from the deep area of the N type substrate 131 toward the junction position under the memory portion 123. As a result, the electrons q generated in the deep area of the memory portion 123 through the photoelectric conversion are discharged in the direction of the N type substrate 131, so that inflow of the charges q into the memory portion 123 is prevented. Therefore, it is possible to suppress noise.

Herein, the noise generated in pixels in a unit pixel 120' in the related art, that is, in the configuration where the first P type well layer 132-1 and the low concentration N type layer area 140 are not provided, will be described with reference to FIGS. 5A to 5C.

Figure 5A:
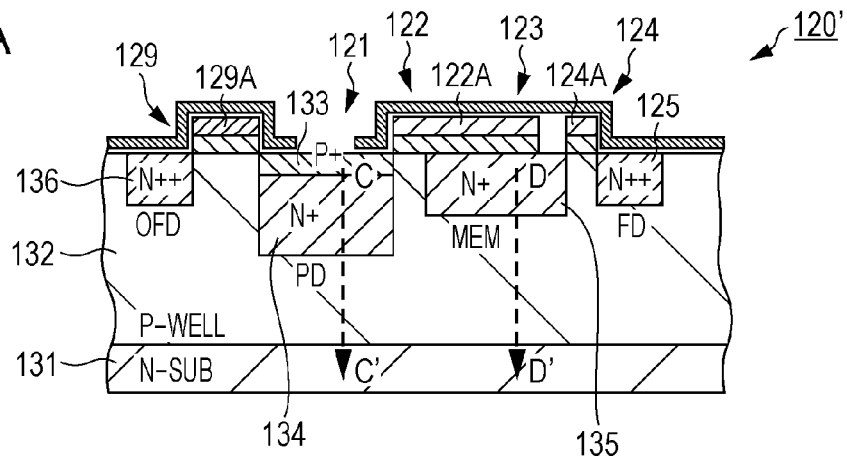
FIGS. 5A to 5C are diagrams illustrating occurrence of noise.

FIG. 5A illustrates a cross-sectional diagram of the unit pixel 120'. FIG. 5B illustrates a potential along the broken-line arrow C-C' illustrated in FIG. 5A. FIG. 5C illustrates a potential along the broken-line arrow D-D' illustrated in FIG. 5A.

Figure 5B:
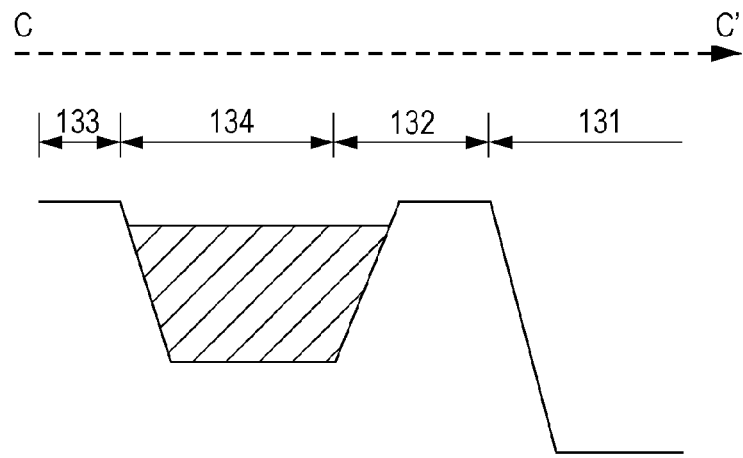
Figure 5C:
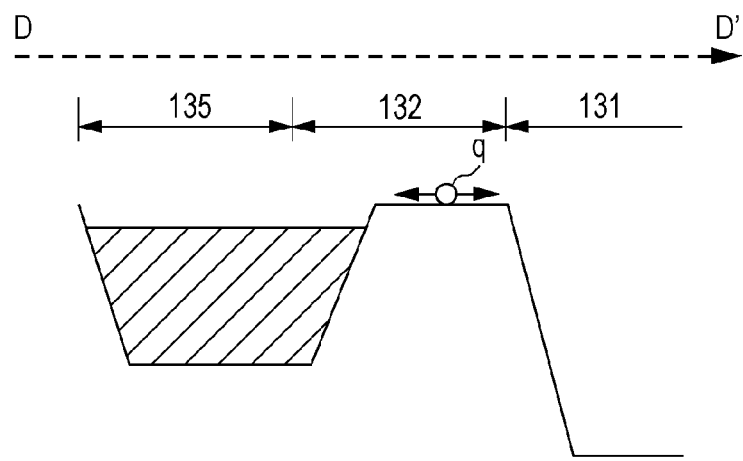

As illustrated in FIGS. 5A to 5C, in the P type well layer 132, since the potential becomes planarized, the charges q may be flowed in any directions. Therefore, the charges q are flowed into the memory portion 123, so that the noise occurs.

On the contrary, in the unit pixel 120 according to the embodiment, since the potential is formed as illustrated in FIG. 4B, the charges q are flowed into the side of the N type substrate 131, so that it is possible to suppress noise occurrence.

In addition, in the structure of the unit pixel 120, there is no problem in that the photodiode 121 and the memory portion 123 are connected to other portions to be short-circuited. For example, similarly to the structure disclosed in Japanese Unexamined Patent Application Publication No. 2008-4692 (refer to FIG. 8 thereof), in the case where the N type layer connected to the charge discharging area is disposed through a portion of the P type well layer under the photodiode and the memory portion, there is a problem in that the N type layer is connected to the photodiode and the memory portion to be short-circuited. However, in the unit pixel 120, since the charges q generated in the area under the memory portion 123 are prevented from being flowed into the memory portion 123 without installation of the N type layer, there is no problem in that the short-circuit described above occurs.

Next, a method of manufacturing the unit pixel 120 will be described.

For example, the P type well layer is formed in the substrate of the unit pixel 120 by injecting P type impurities into an N type silicon substrate. Therefore, in the formation of the low concentration N type layer area 140, the P type well layer with the depth Z2 is formed in an area other than the area, where the low concentration N type layer area 140 is formed, by injecting the P type impurities, and after that, the P type impurities are injected over the entire surface, so that the low concentration N type layer area 140 may be formed.

Figure 6:
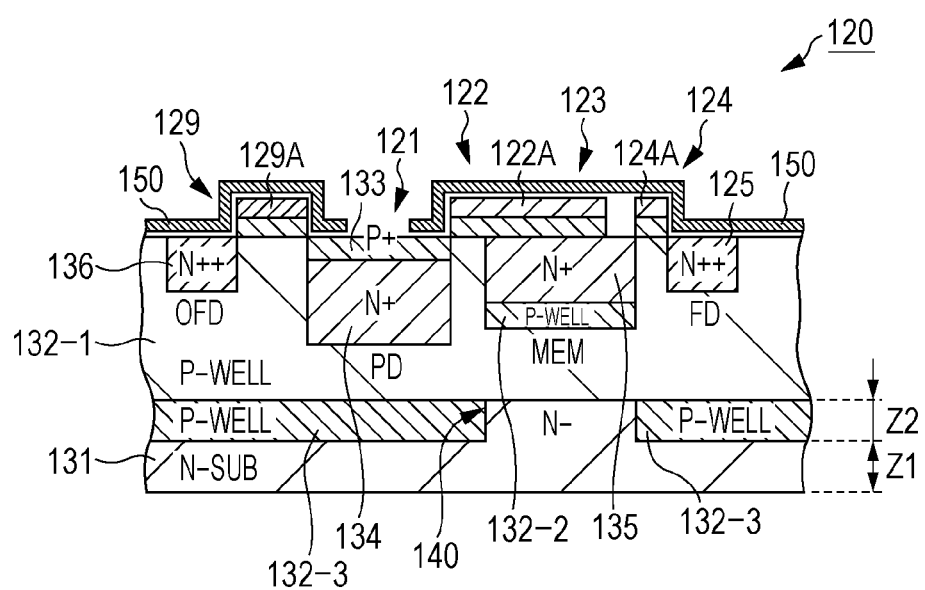
FIG. 6 is a diagrammatic cross-sectional diagram illustrating the unit pixel.

In other words, as illustrated in FIG. 6, a third P type well layer 132-3 is formed in a range of the depth Z2 where the low concentration N type layer area 140 is formed, so that the area where the third P type well layer 132-3 is not formed becomes the low concentration N type layer area 140. In the case of this structure, the P type well layer of the deepest portion under the memory portion 123 may not be formed by changing the mask shape of the third P type well layer 132-3 located n the deepest portion of the P type well layer at the time of lithography from the mask shape of the time of forming a general P type well layer.

In addition, the area where the third P type well layer 132-3 is not formed may not be aligned with the memory portion 123 as seen in the plan view. For example, the area where the third P type well layer 132-3 is not formed may be protruded from a unit under the memory portion 123 in the direction other than the side of the photodiode 121 among the areas under the memory portion 123. In addition, in the case where the area where the third P type well layer 132-3 is not formed is protruded from the side of the photodiode 121, there is a problem in that the charges generated through the photoelectric conversion in the deep area under the photodiode 121 may be easily discharged at the side of the N type substrate 131. Therefore, it is preferable that the area where the third P type well layer 132-3 is not formed is not protruded from the side of the photodiode 121.

Next, a process of manufacturing the unit pixel 120 will be described with reference to FIGS. 7A to 7D.

In the first process, as illustrated in FIG. 7A, a process of forming the first P type well layer 132-1 and the third P type well layer 132-3 is performed.

In other words, the P type well layer 132-3 having the thickness Z2 is formed in the lowermost layer of the layer, where the P type well layer is to be formed, by performing ion injection of the P type impurities on the N type substrate by using a mask which is formed so as to cover a range where the low concentration N type layer area 140 is formed. In addition, the first P type well layer 132-1 is formed by performing ion injection of the P type impurities on the N type substrate by using a general mask (a mask for forming the P type well layer in the related art).

Therefore, the area where the third P type well layer 132-3 has not been formed becomes the low concentration N type layer area 140. In addition, the low concentration N type layer area 140 is influenced by the side of the first P type well layer 132-1, so that the concentration of the N type impurity thereof is lower than that of the N type substrate 131.

In the second process, as illustrated in FIG. 7B, a process of forming the second P type well layer 132-2 and the N type buried channel 135 is performed.

In other words, the second P type well layer 132-2 of which the concentration of the P type impurity is higher than that of the first P type well layer 132-1 is formed by performing ion injection of the P type impurities by using the mask where only the area where the second P type well layer 132-2 and the N type buried channel 135 are to be formed is opened. In addition, the buried channel 135 is formed by performing ion injection of the P type impurities by using the same mask. In this manner, the second P type well layer 132-2 and the N type buried channel 135 are formed by using the same mask.

In the third process, as illustrated in FIG. 7C, the gate electrode 122A, the gate electrode 124A, and the gate electrode 129A are formed on the substrate. In the fourth process, the photodiode 121, the floating diffusion area 125, and the charge discharging portion 129 are formed on the surface of the substrate. After that, the unit pixel 120 illustrated in FIG. 6 is manufactured by forming the light shielding film 150 through an insulating film on the substrate so that an opening for the photodiode 121 is formed.

Herein, in general, when the P type well layer is formed in the N type silicon substrate by injecting the P type impurities, the P type well layer is not formed through once performance, but the P type well layer is formed through several separated times of performance, that is, multiple stages. As illustrated in FIG. 6, besides the configuration where the third P type well layer 132-3 is formed as one state in the depth range Z2 where the low concentration N type layer area 140 is formed, the P type well layer may be formed as multiple stages in the depth range Z2 where the low concentration N type layer area 140 is formed.

Figure 8:
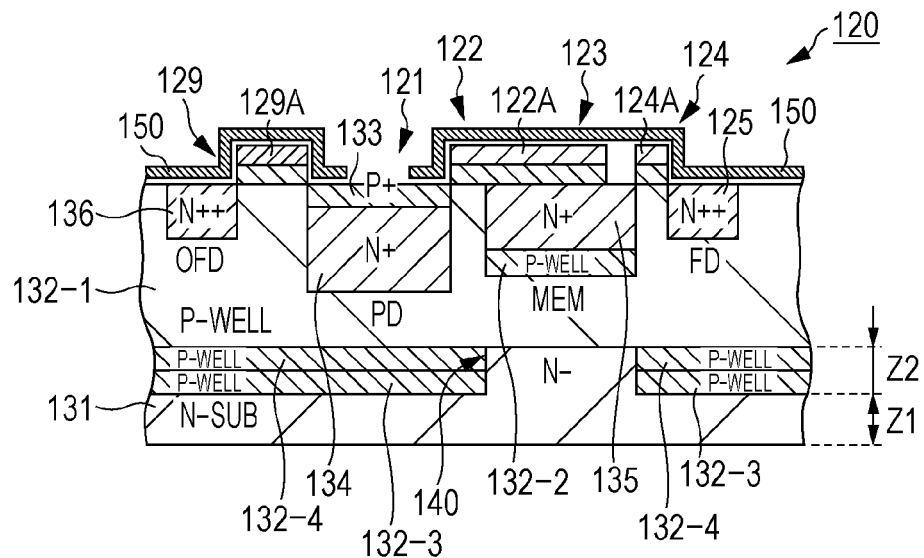
FIG. 8 is a diagrammatic cross-sectional diagram illustrating a unit pixel.

For example, as illustrated in FIG. 8, the third P type well layer 132-3 and the fourth P type well layer 132-4 are formed in the depth range Z2 where the low concentration N type layer area 140 is formed, so that the area where the third P type well layer 132-3 and the fourth P type well layer 132-4 are not formed becomes the low concentration N type layer area 140. Therefore, the electric field is generated in the direction from the deep area under the memory portion 123 to the surface of the substrate, so that the charges generated in the deep area under the memory portion 123 through the photoelectric conversion may be discharged to the side of the substrate. As a result, it is possible to suppress the noise.

In addition, although FIG. 8 illustrates an example where two layers of the third P type well layer 132-3 and the fourth P type well layer 132-4 are formed, the P type well layer having multiple layers of two or more layers may be formed in the depth range Z2 for the purpose of forming the low concentration N type layer area 140.

Figure 9:
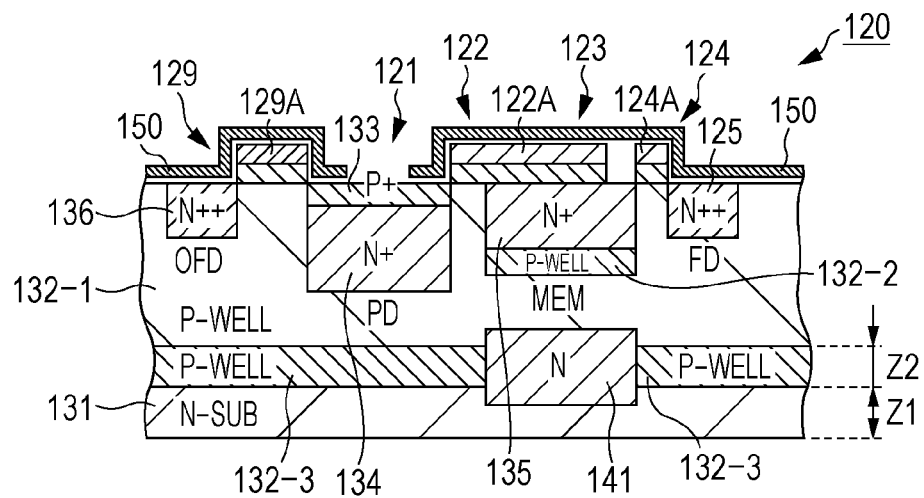
FIG. 9 is a diagrammatic cross-sectional diagram illustrating a second configuration of the unit pixel.

Next, FIG. 9 is a diagrammatic cross-sectional diagram illustrating a second configuration of the unit pixel 120.

As illustrated in FIG. 9, the unit pixel 120 has a structure where the N type layer 141 is formed in a portion of the area under the memory portion 123 in the third P type well layer 132-3 which is the lowermost layer of the P type well layer.

In this manner, in the unit pixel 120 having a structure having the N type layer 141, the N type layer 141 is formed in the P type well layer by performing ion injection by using a mask having the same shape as that of the P type well layer 132-2 formed under the memory portion 123. Therefore, since the electric field may be formed in the direction toward the surface of the substrate by deepening the potential in the deep area under the memory portion 123, the charges generated in the deep area under the memory portion 123 through the photoelectric conversion may be discharged at the side of the substrate. As a result, it is possible to suppress noise.

In addition, in the unit pixel 120 having this structure, since the mask used for forming the second P type well layer 132-2 may be used just as it is at the time of ion injection for forming the N type layer 141, it is unnecessary to use a new mask, so that it is possible to suppress an increase in the number of processes in the manufacturing process at the minimum.

Next, a process of manufacturing the unit pixel 120 having the second configuration will be described with reference to FIGS. 10A to 10D.

Figure 10A:
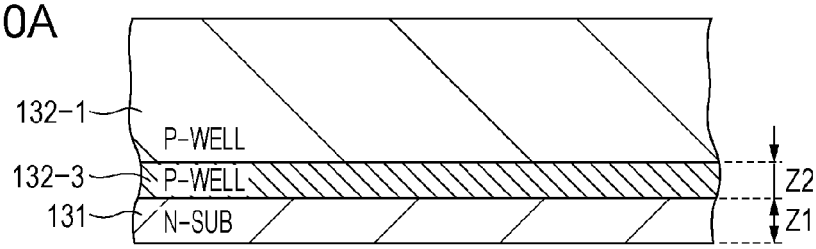
FIGS. 10A to 10D are diagrams illustrating a process of manufacturing a unit pixel.

In the first process, as illustrated in FIG. 10A, the first P type well layer 132-1 and the third P type well layer 132-3 which becomes the lowermost layer of the P type well layer are formed in the N type substrate.

Figure 10B:
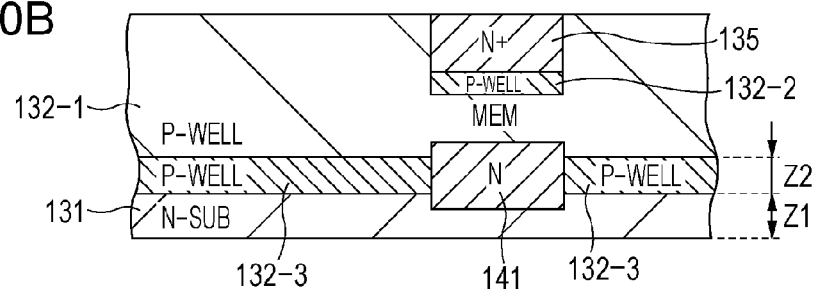

In the second process, as illustrated in FIG. 10B, the N type buried channel 135 is formed on the surface of the substrate, and the second P type well layer 132-2 is formed under the N type buried channel 135, so that the memory portion 123 is provided. Next, the N type layer 141 is formed in the depth area of the third P type well layer 132-3 by injecting.

Figure 10C:
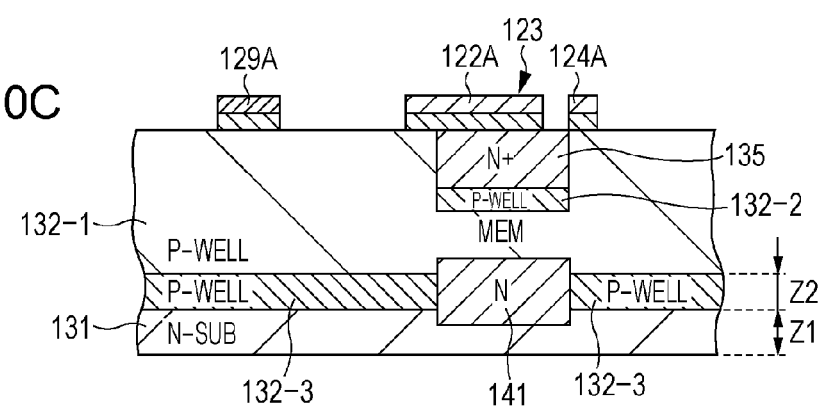
Figure 10D:
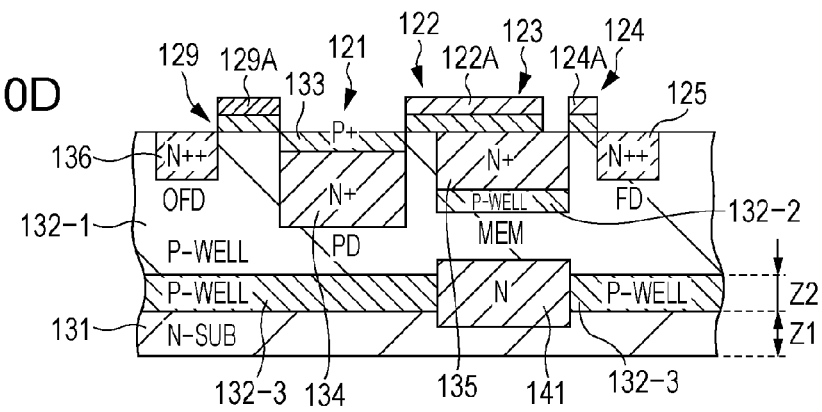

In the third process, as illustrated in FIG. 10C, the gate electrode 122A, the gate electrode 124A, and the gate electrode 129A are formed on the substrate. In the fourth process, the photodiode 121, the floating diffusion area 125, and the charge discharging portion 129 are formed on the surface of the substrate. After that, a light shielding film 150 is formed through an insulating film on the substrate so that an opening of the photodiode 121 is formed. As a result, the unit pixel 120 illustrated in FIG. 9 is manufactured.

In addition, the N type layer 141 formed in the depth of the third P type well layer 132-3 is formed, for example, by injecting and thermally diffusing arsenic. In addition, instead of forming the area of the side of the surface of the silicon substrate as the N type layer, for example, the N type layer may be formed by using an epitaxial layer grown on the silicon substrate. In addition, in the unit pixel 120 of FIG. 9, although the N type layer 141 and the second P type well layer 132-2 may be formed by using the same mask, different masks may be used for the formation.

Figure 11A:
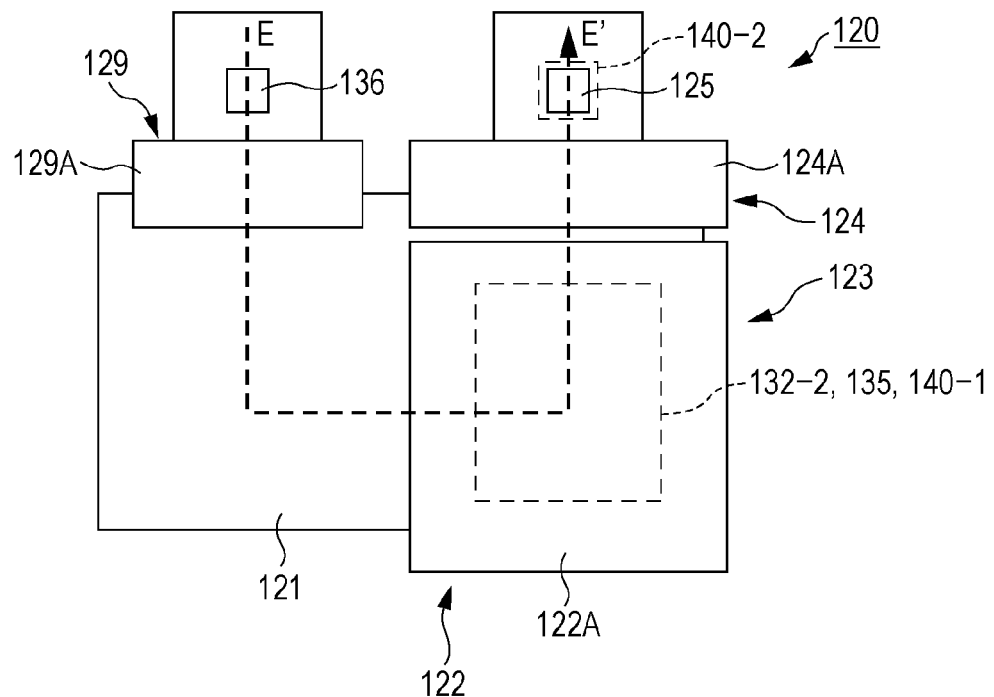
FIGS. 11A and 11B are diagrams illustrating a third configuration of the unit pixel.
Figure 11B:
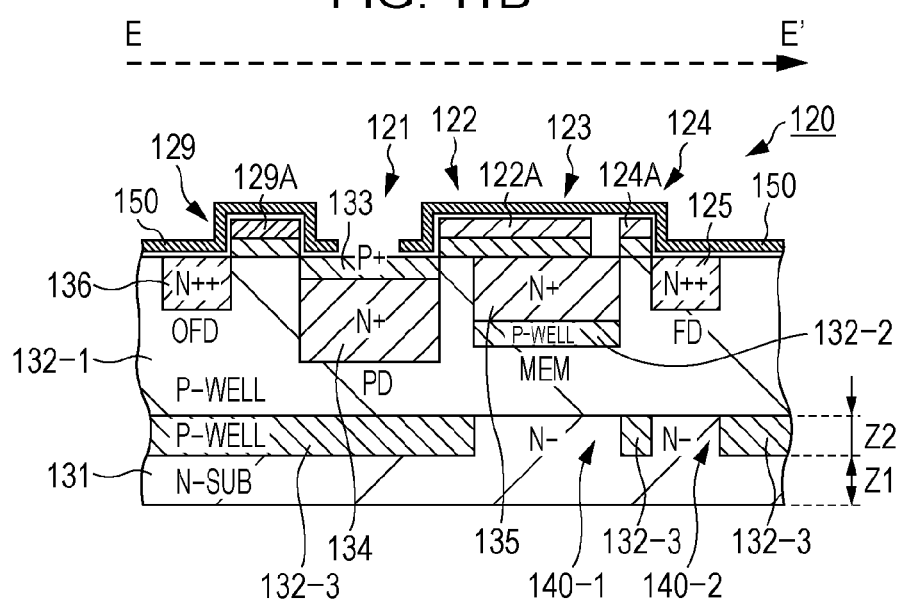

Next, a third configuration of the unit pixel 120 will be described with reference to FIGS. 11A and 11B. FIG. 11A illustrates a plan diagram of the unit pixel 120 having the third configuration. FIG. 11B illustrates a cross-sectional diagram of the unit pixel 120 having the third configuration taken along the arrow E-E' of the plan diagram.

As illustrated in FIGS. 11A and 11B, the unit pixel 120 is configured to have a structure where the first low concentration N type layer area 140-1 and the second low concentration N type layer area 140-2 are formed in a depth area of the third P type well layer 132-3 which is the lowermost layer of the P type well layer. The first low concentration N type layer area 140-1 is formed to correspond to the low concentration N type layer area 140 of FIG. 2, and the second low concentration N type layer area 140-2 is formed under the floating diffusion area 125.

In this manner, the second low concentration N type layer area 140-2 is provided in the depth area under the floating diffusion area 125, so that the electric field may also be generated in the area under the floating diffusion area 125 in the direction toward the surface of the substrate. Therefore, the charges generated in the depth area under the floating diffusion area 125 through the photoelectric conversion may be discharged at the side of the substrate. Therefore, in the CMOS image sensor 100 using a transferring method where the charges are retained in the floating diffusion area 125, it is possible to suppress the noise in the floating diffusion area 125.

In addition, the first low concentration N type layer area 140-1 and the second low concentration N type layer area 140-2 may be integrally configured. In addition, a multiple-stage P type well layer may be formed in the depth area of the first low concentration N type layer area 140-1 and the second low concentration N type layer area 140-2. In addition, by exchanging the first low concentration N type layer area 140-1 and the second low concentration N type layer area 140-2, the N type layer 141 illustrated in FIG. 9 may be formed.

Figure 12A:
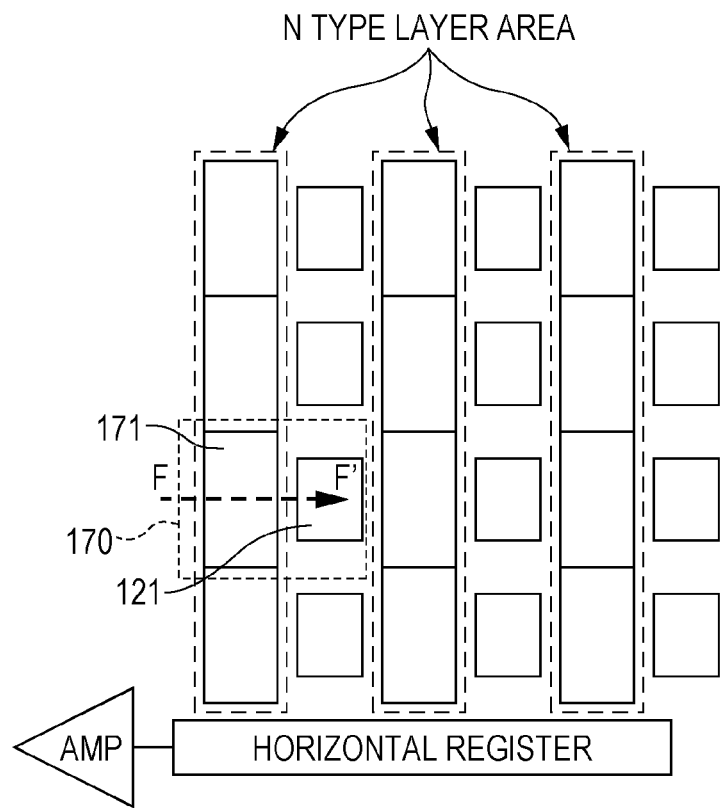
FIGS. 12A and 12B are diagrams illustrating a fourth configuration of the unit pixel.
Figure 12B:
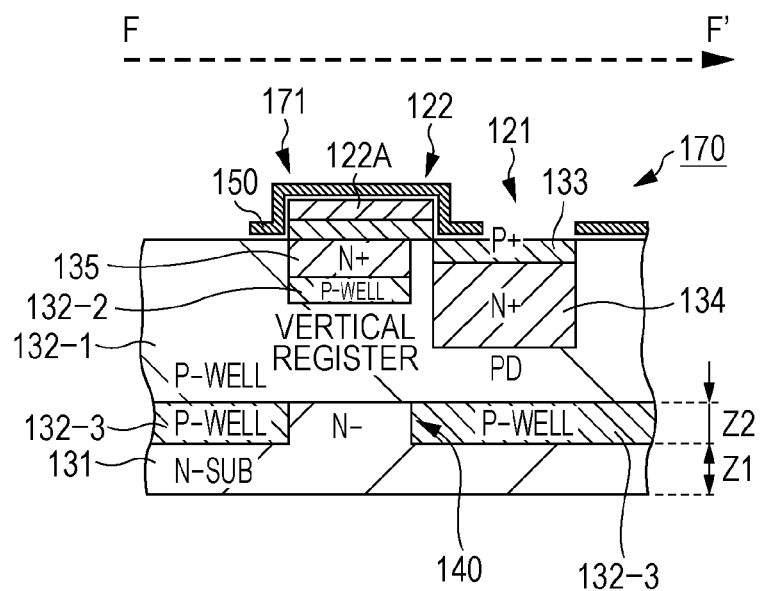

Next, FIGS. 12A and 12B are diagrams illustrating a fourth configuration of the unit pixel.

FIGS. 12A and 12B illustrate a configuration where the second P type well layer 132-2 and the low concentration N type layer area 140 are adapted to a CCD. FIG. 12A illustrates a plan diagram of a CCD, and FIG. 12B illustrates a cross-sectional diagram of a unit pixel taken along the arrow F-F' of the plan diagram of FIG. 12A.

In the unit pixel 170 illustrated in FIGS. 12A and 12B, the second P type well layer 132-2 is formed under the buried channel 135 constituting the vertical register 171 (transfer unit) which temporarily reads the charges of the photodiode 121 and transfers the charges, and the low concentration N type layer area 140 is formed in the deep area of the vertical register 171. In other words, the low concentration N type layer area 140 is provided in the deep area of the vertical register 171 by not forming the third P type well layer 132-3.

In the unit pixel 170 having this configuration, the electric field is formed in the direction from the deep area under the vertical register 171 toward the surface of the substrate, so that the charges generated in the deep area under the vertical register 171 through the photoelectric conversion may be discharged at the side of the substrate. As a result, it is possible to prevent smear deterioration in the CCD. In addition, a multiple-stage P type well layer may be formed in the depth area of the low concentration N type layer area 140. In addition, by replacing with the low concentration N type layer area 140, the N type layer 141 illustrated in FIG. 9 may be formed in the area under the vertical register 171. In addition, the low concentration N type layer area 140 may be formed under at least one of the vertical register 171 and the horizontal register (transfer unit) which transfers the charges, which are transferred by the vertical register 171, to an amplifier (charge voltage conversion unit).

In addition, in the embodiment, although an example using the buried type photodiode 121 is described, for example, a photodiode having no depletion preventing layer may be used. In addition, the third P type well layer 132-3 is formed, for example, by injecting and thermally diffusing arsenic. However, instead of forming the area at the side of the surface of the silicon substrate as the P type layer in this manner, for example, the P type layer may be formed by an epitaxial layer grown on the silicon substrate.

[Other Configurations of Unit Pixel]

The invention may be employed in pixel structures different from that of the unit pixel 120 according to the aforementioned embodiments. Hereinafter, the structures different from that of the unit pixel 120 employing the invention are described. In addition, in the figures hereinafter, the same components as those of FIGS. 5A to 5C are denoted by the same reference numerals, and the description thereof is suitably omitted.

[First Configuration Different from that of Unit Pixel]

Figure 13:
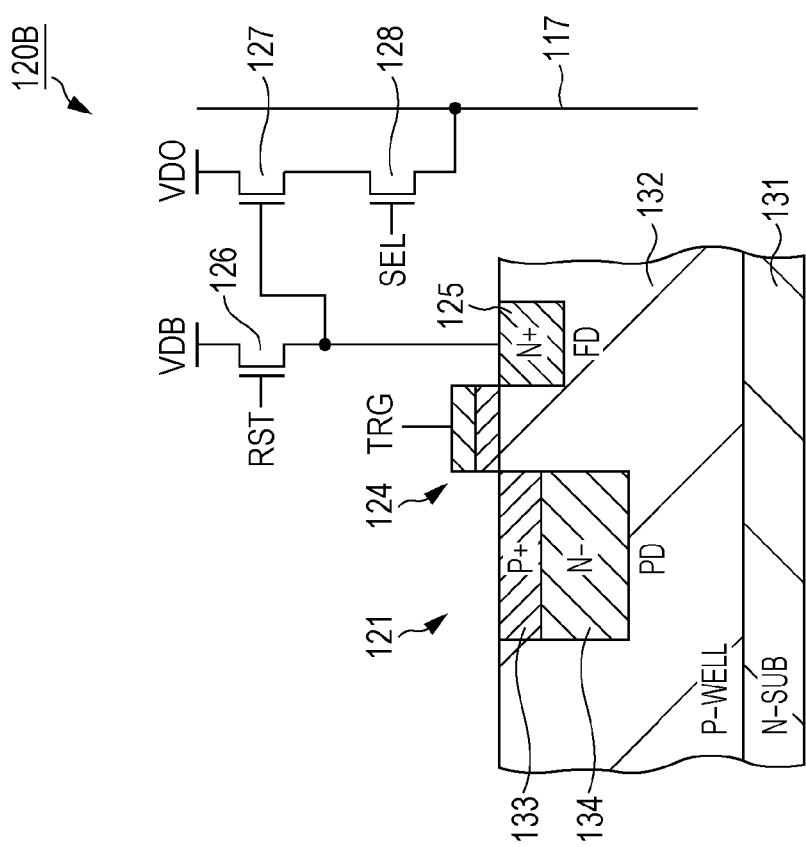
FIG. 13 is a diagram illustrating an example of a first configuration different from that of the unit pixel.

FIG. 13 is a diagram illustrating a structure of a unit pixel 120B as an example of a first configuration different from that of the unit pixel 120.

In the unit pixel 120B, the first transfer gate 122 and the memory portion 123 in the unit pixel 120 of FIGS. 5A to 5C are omitted, and the photodiode 121 and the floating diffusion area 125 are disposed to be adjacent to each other with the P type well layer 132 interposed therebetween. The second transfer gate 124 is disposed above the P type well layer 132 between the photodiode 121 and the floating diffusion area 125.

The global exposure operation in the unit pixel 120B will be described. First, after the charge discharging operation of erasing the accumulated charges of the buried type photodiode 121 simultaneously across the all pixels is performed, the exposure is started. Therefore, the photoelectric charges are stored in the PN junction capacitor of the photodiode 121. At the exposure period ending time, the second transfer gate 124 is simultaneously turned on in the all pixels, so that all the accumulated photoelectric charges are transferred to the floating diffusion area 125. By closing the second transfer gates 124, the photoelectric charges accumulated in the same exposure period in the all pixels are retained in the floating diffusion area 125. After that, the photoelectric charges retained in the floating diffusion area 125 are sequentially read out as the pixel signal through the vertical signal line 117. Finally, the floating diffusion area 125 is reset, so that the reset level is read out.

Accordingly, in the unit pixel 120B, the floating diffusion area 125 becomes the charge retaining area in the case where the global exposure operation is performed. In the configuration of the unit pixel 120B, the second P type well layer 132-2 and the low concentration N type layer area 140 illustrated in FIG. 2 are also provided, so that the invention may be adapted.

[Second Configuration Different from that of Unit Pixel]

Figure 14:
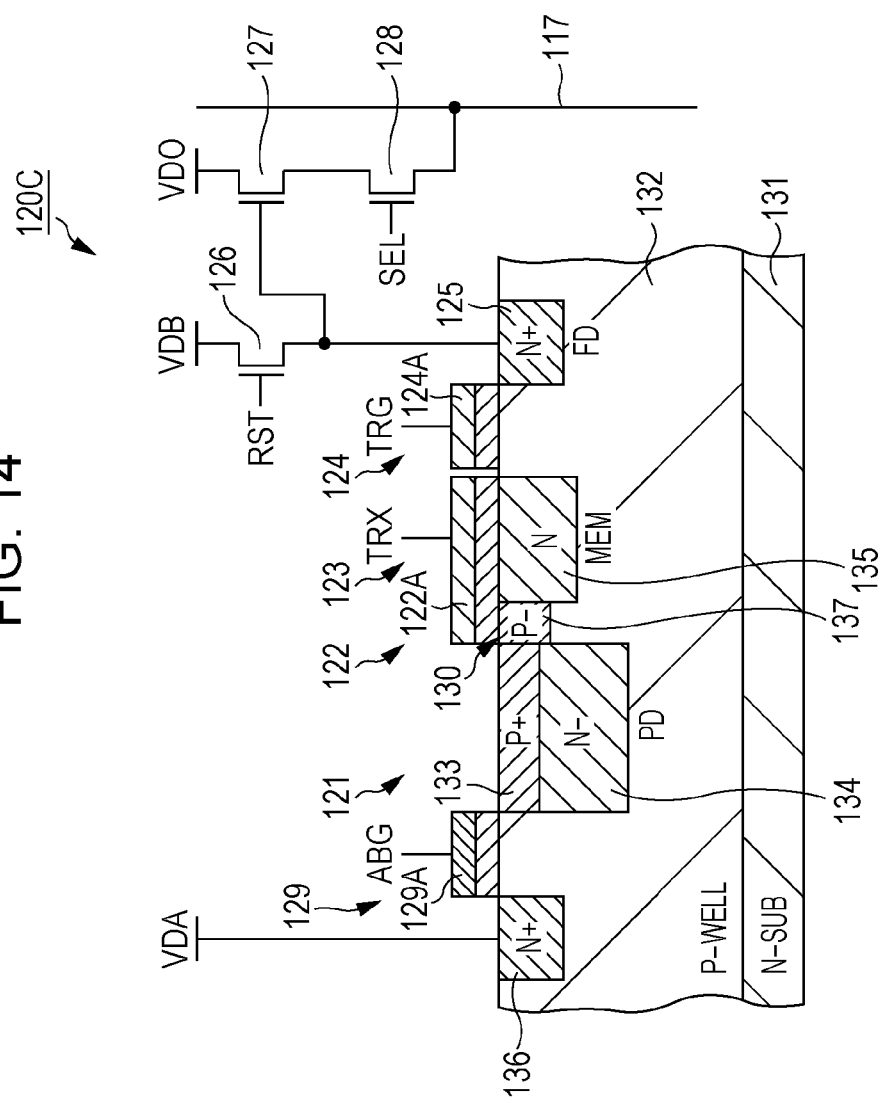
FIG. 14 is a diagram illustrating an example of a second configuration different from that of the unit pixel.

FIG. 14 is a diagram illustrating a structure of a unit pixel 120C as an example of a second configuration different from that of the unit pixel 120.

The unit pixel 120C is different from the unit pixel 120 in that an overflow path 130 is formed by providing a P– impurity diffusion area 137 under the gate electrode 122A and in the boundary portion between the photodiode 121 and the memory portion 123.

In order to form the overflow path 130, it is necessary to decrease the potential of the impurity diffusion area 137. The P– impurity diffusion area 137 may be formed by decreasing P impurity concentration by lightly doping N impurities in the impurity diffusion area 137. Alternatively, in the case where the P impurities are doped in the impurity diffusion area 137 at the time of forming a potential barrier, the P– impurity diffusion area 137 may be formed by decreasing the P impurity concentration.

In the unit pixel 120C, the overflow path 130 formed in the boundary portion between the photodiode 121 and the memory portion 123 is used as a unit for preferentially accumulating the charges, which are generated at low illumination, in the photodiode 121.

The potential of the boundary portion between the photodiode 121 and the memory portion 123 is decreased by providing the P– impurity diffusion area 137 in the boundary portion. The portion of which the potential is decreased becomes the overflow path 130. Next, the charges which are generated from the photodiode 121 and overcome the potential of the overflow path 130 are automatically leaked into the memory portion 123 to be accumulated therein. In other words, the charges which are generated below the potential of the overflow path 130 are accumulated in the photodiode 121.

The overflow path 130 has a function as an intermediate charge transfer portion. In other words, in the exposure period when all the unit pixels simultaneously perform the imaging operation, the overflow path 130 as the intermediate charge transfer portion transfers the charges, which are generated in the photodiode 121 through the photoelectric conversion and which exceeds a predetermined charge amount defined by the potential of the overflow path 130, as a signal charge to the memory portion 123.

In addition, in the example of FIG. 14, the structure where the overflow path 130 is formed by providing the P– impurity diffusion area 137 is employed. However, the structure where the overflow path 130 is formed by providing the N– impurity diffusion area 137 instead of providing the P- impurity diffusion area 137 may be employed.

In the unit pixel 120C, the floating diffusion area 125 and the buried channel 135 become the charge retaining areas in the case where the global exposure operation is performed. In the configuration of the unit pixel 120C, the second P type well layer 132-2 and the low concentration N type layer area 140 illustrated in FIG. 2 are also provided, so that the invention may be adapted.

[Third Configuration Different from that of Unit Pixel]

Figure 15:
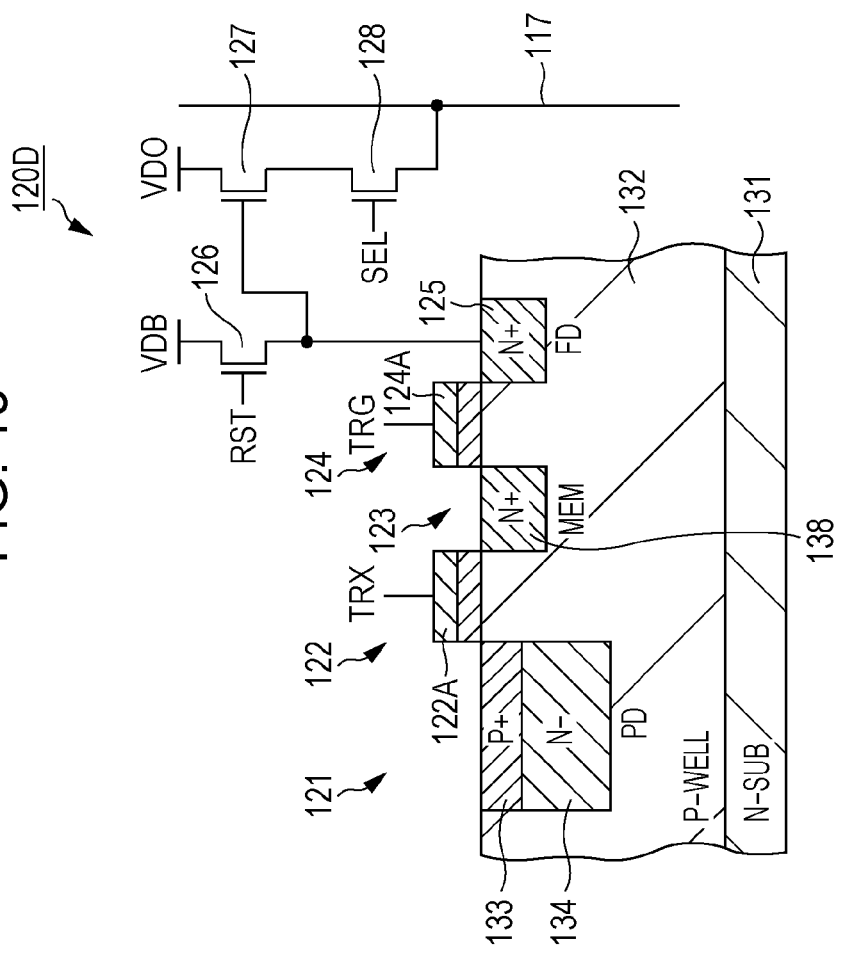
FIG. 15 is a diagram illustrating an example of a third configuration different from that of the unit pixel.

FIG. 15 is a diagram illustrating a structure of a unit pixel 120D as an example of a third configuration different from that of the unit pixel 120.

The unit pixel 120D has a structure which is formed by providing the memory portion 123 such as the floating diffusion area 125 to the structure of the unit pixel 120B of FIG. 13. In other words, in the unit pixel 120D, the gate electrode 122A of the first transfer gate 122 is provided in an upper portion of the P type well layer 132 between the photodiode 121 and the memory portion 123. In addition, in the unit pixel 120D, the memory portion 123 is formed by the N type layer 138 such as the floating diffusion area 125.

The global exposure operation in the unit pixel 120D is performed in the following procedure. First, the charge discharging operation is simultaneously performed in the all pixels, and simultaneous exposure is started. The generated photoelectric charges are accumulated in the photodiode 121. At the exposure ending time, the first transfer gate 122 is simultaneously turned on in the all pixels, so that all the accumulated photoelectric charges are transferred to the memory portion 123 to be retained therein. After the exposure is ended, as sequential operations, the reset level and the signal level are read out. In other words, the floating diffusion area 125 is reset, and after that, the reset level is read out. Subsequently, the charges retained in the memory portion 123 are transferred to the floating diffusion area 125, so that the signal level is read out.

In the unit pixel 120D, the N type layer 138 of the memory portion 123 becomes the charge retaining area in the case where the global exposure operation is performed. In the configuration of the unit pixel 120D, the second P type well layer 132-2 and the low concentration N type layer area 140 illustrated in FIG. 2 are also provided, so that the invention may be adapted.

[Fourth Configuration Different from that of Unit Pixel]

Figure 16:
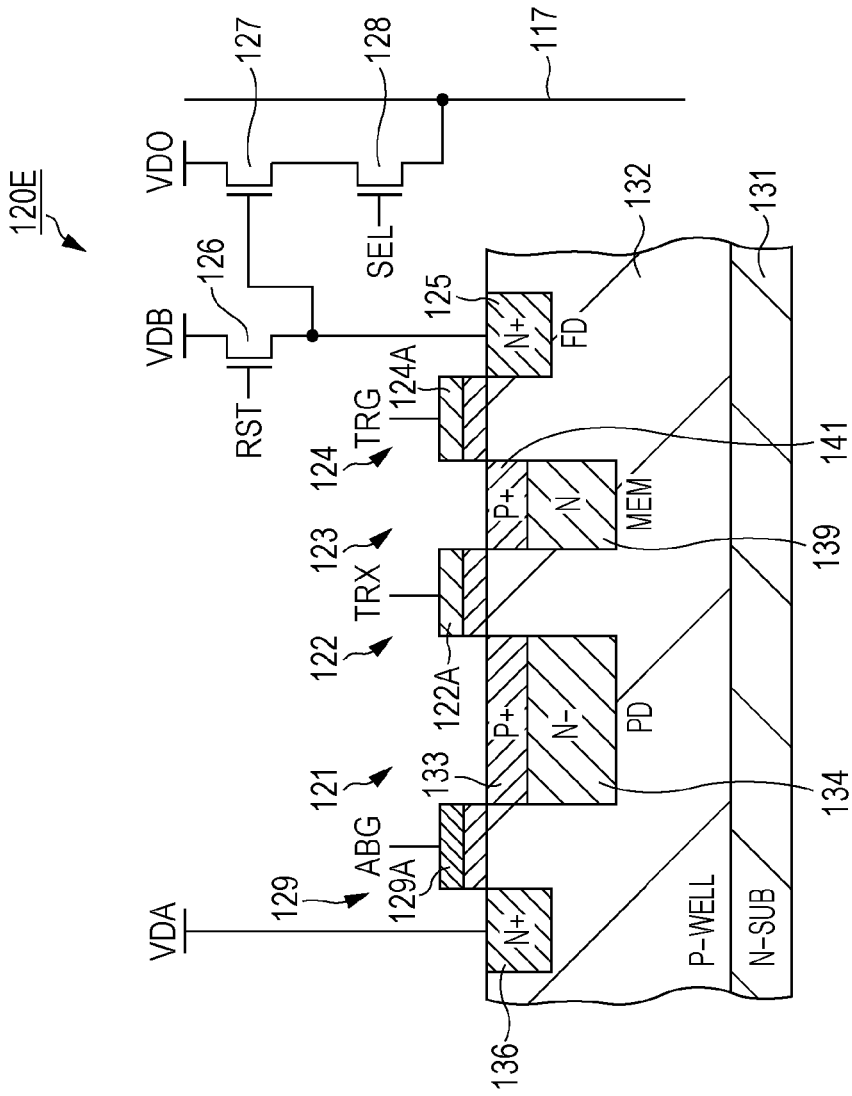
FIG. 16 is a diagram illustrating an example of a fourth configuration different from that of the unit pixel.

FIG. 16 is a diagram illustrating a structure of a unit pixel 120E as an example of a fourth configuration different from that of the unit pixel 120.

In the unit pixel 120E of FIG. 16, a structure where the memory portion 123 is formed by using a buried type N type diffusion area 139 instead of the buried channel 135 is employed.

In the case where the memory portion 123 is formed by using the N type diffusion area 139, it is also possible to obtain the same function and effect as those in the case where the memory portion 123 is formed by using the buried channel 135. More specifically, the N type diffusion area 139 is formed inside the P type well layer 132, and the P type layer 141 is formed at the side of the surface of the substrate, so that it is possible to prevent the dark current generated in the boundary surface from being accumulated in the N type diffusion area 139 of the memory portion 123. Therefore, it is possible to improve image quality.

Herein, it is preferable that the impurity concentration of the N type diffusion area 139 of the memory portion 123 is set to be lower than the impurity concentration of the floating diffusion area 125. According to this setting of the impurity concentration, it is possible to increase transfer efficiency of the charges which are transferred from the memory portion 123 to the floating diffusion area 125 by the second transfer gate 124. The global exposure operation in the unit pixel 120E is the same as that in the unit pixel 120 of FIG. 2.

In addition, in the configuration of the unit pixel 120E illustrated in FIG. 16, the memory portion 123 is formed by using the buried type N type diffusion area 139. However, although the dark current generated in the memory portion 123 is increased, a non-buried type structure may be employed.

In addition, in the configuration of the unit pixel 120E, similarly to the case of the unit pixel 120 of FIG. 2, a configuration where the charge discharging portion 129 is omitted and all the transfer pulse TRX and TRS and the reset pulse RST are in the active state may be employed. According to the configuration, it is possible to obtain the same function and effect as those of the charge discharging portion 129. In other words, it is possible to discharge the charges of the photodiode 121 and to release the charges overflowed from the photodiode 121 to the side of the substrate during the reading period.

In the unit pixel 120E, the N type diffusion area 139 of the memory portion 123 becomes the charge retaining area in the case where the global exposure operation is performed. In the configuration of the unit pixel 120E, the second P type well layer 132-2 and the low concentration N type layer area 140 illustrated in FIG. 2 are also provided, so that the invention may be adapted.

[Fifth Configuration Different from that of Unit Pixel]

Figure 17:
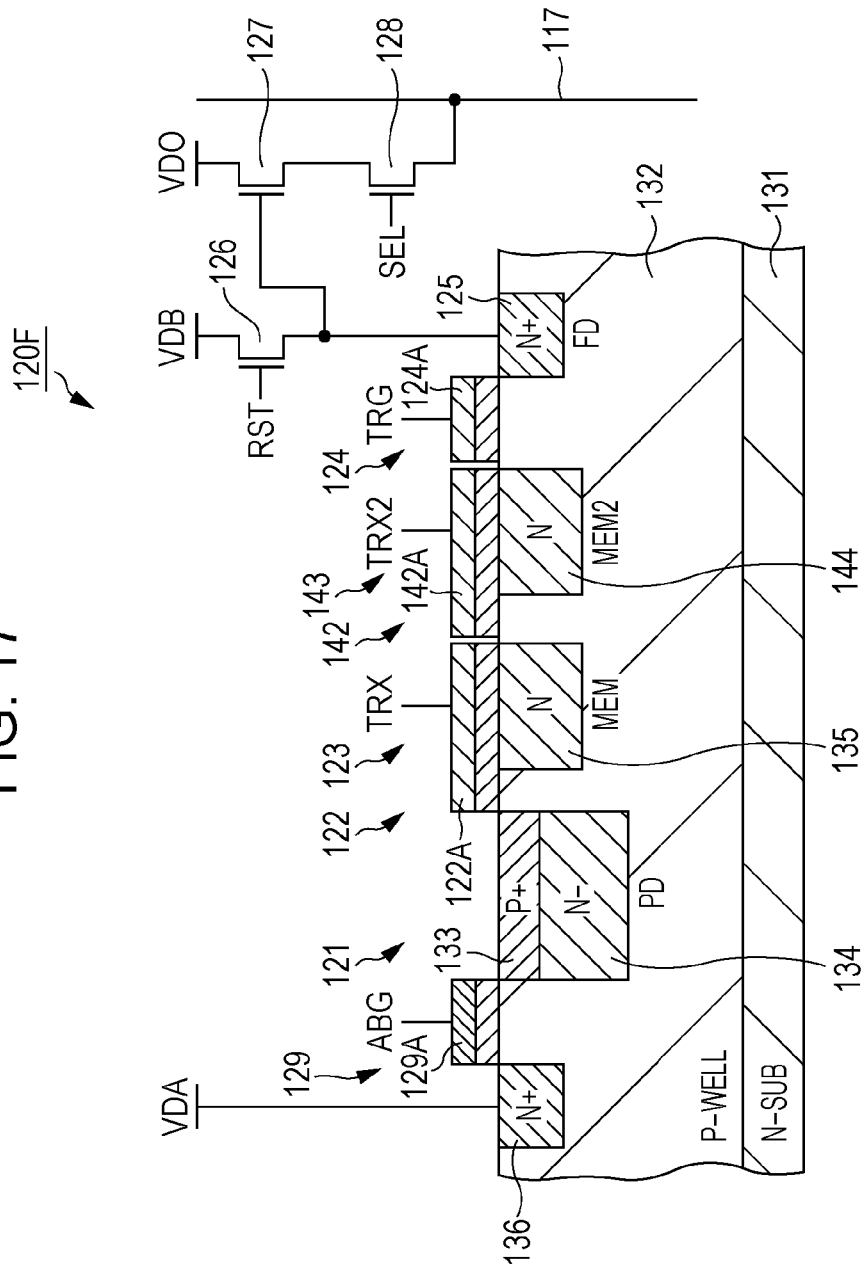
FIG. 17 is a diagram illustrating an example of a fifth configuration different from that of the unit pixel.

FIG. 17 is a diagram illustrating a structure of a unit pixel 120F as an example of a fifth configuration different from that of the unit pixel 120.

In the unit pixel 120 of FIGS. 5A to 5C, one memory portion (MEM) 123 is disposed between the photodiode 121 and the floating diffusion area 125. However, in the unit pixel 120F of FIG. 17, a memory portion (MEM2) 143 is additionally provided thereto. In other words, two stages of the memory portions are configured.

The third transfer gate 142 transfers the charges accumulated in the memory portion 123 through application of the transfer pulse TRX2 to the gate electrode 142A. The memory portion 143 is formed by using the N type buried channel 144 formed under the gate electrode 142A to accumulate the charges from the memory portion 123 by the third transfer gate 142. The memory portion 143 is formed by using the buried channel 144, so that it is possible to suppress the occurrence of dark current in the boundary surface. Therefore, it is possible to improve image quality.

Since the memory portion 143 has the same configuration as that of the memory portion 123, similarly to the memory portion 123, in the case of applying modulation, it is possible to increase the saturated charge amount of the memory portion 143 in comparison with the case of applying no modulation.

In the global exposure operation of the unit pixel 120F, the photoelectric charges accumulated simultaneously in the all pixels are retained in the photodiode 121 or the memory portion 123. The memory portion 143 is used to retain the photoelectric charges until the pixel signal is read out.

In the unit pixel 120F, the buried channel 135 of the memory portion 123 and the buried channel 144 of the memory portion 143 become the charge retaining areas in the case where the global exposure operation is performed. In the configuration of the unit pixel 120F, the second P type well layer 132-2 and the low concentration N type layer area 140 illustrated in FIG. 2 are also provided, so that the invention may be adapted.

In this manner, the invention may employ the structures different from that of the unit pixel 120. In addition, the invention may be adapted to the configuration having conductive polarities (N type, P type) opposite to those in the unit pixels 120 and 120B to 120F.

[Example of Configuration of Electronic Apparatus Employing the Invention]

In addition the invention is not limited to the adaptation to the solid-state imaging device. In other words, the invention may be adapted to overall electronic apparatuses using the solid-state imaging device for an image capturing portion (photoelectric conversion portion), for example, an imaging apparatus such as a digital still camera or a video camera, a mobile terminal apparatus having an imaging function, a copier using the solid-state imaging device for an image reading portion, or the like. The solid-state imaging device may be configured in a form of one chip or in a form of a module having an imaging function, in which an imaging portion and a signal processing portion or an optical system are collectively packaged.

Figure 18:
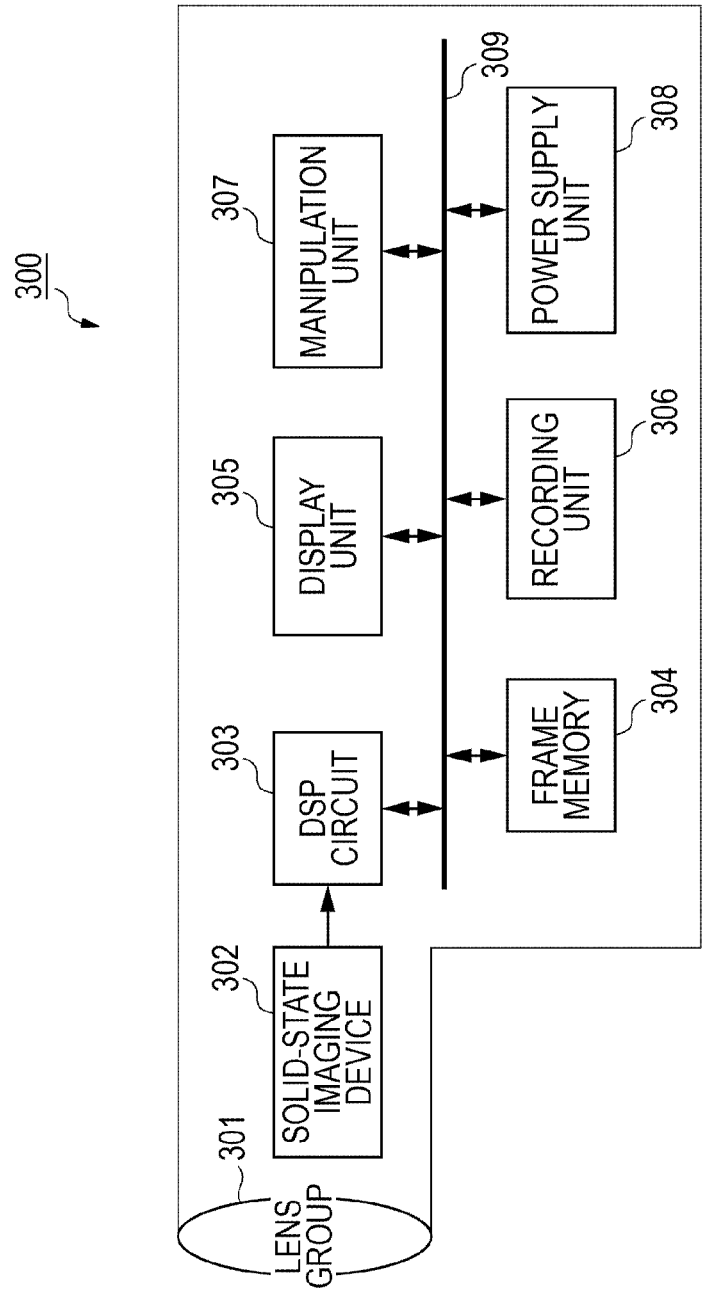
FIG. 18 is a block diagram illustrating an example of a configuration of an electronic apparatus employing the invention.

FIG. 18 is a block diagram illustrating an example of a configuration of an imaging apparatus as an electronic apparatus employing the invention.

In FIG. 18, an imaging apparatus 300 includes an optical unit 301 constructed with lens groups or the like, a solid-state imaging device (imaging device) 302 having the configuration of the aforementioned unit pixel 120, and a DSP (Digital Signal Processor) circuit 303 which is a camera signal process circuit. In addition, the imaging apparatus 300 also includes a frame memory 304, a display unit 305, a recording unit 306, a manipulation unit 307, and a power supply unit 308. The DSP circuit 303, the frame memory 304, the display unit 305, the recording unit 306, the manipulation unit 307, and the power supply unit 308 are connected to each other through a bus line 309.

The optical unit 301 acquires incident light (image light) from a subject and focuses an image on an imaging plane of the solid-state imaging device 302. The solid-state imaging device 302 converts the light amount of the incident light focused on the imaging plane by the optical unit 301 into an electric signal in unit of a pixel and outputs the pixel signal. As the solid-state imaging device 302, the solid-state imaging device of the CMOS image sensor 100, that is, the solid-state imaging device capable of implementing imaging without distortion through the global exposure and suppressing a leakage signal suppression ratio for each of the RGB pixels may be used.

The display unit 305 is configured with, for example, a panel type display apparatus such as a liquid crystal panel or an organic EL (Electro Luminescence) panel to display a moving picture or a still image which is imaged by the solid-state imaging device 302. The recording unit 306 records the moving picture or the still image which are imaged by the solid-state imaging device 302 in a recording medium such as a video tape or a DVD (Digital Versatile Disc).

The manipulation unit 307 issues manipulation commands with respect to various functions of the imaging apparatus 300 according to use's manipulation. The power supply unit 308 appropriately supplies various powers as operation powers of the DSP circuit 303, the frame memory 304, the display unit 305, the recording unit 306, and the manipulation unit 307.

As described above, by using the CMOS image sensor 100 according to the aforementioned embodiments as the solid-state imaging device 302, it is possible to implement imaging without distortion through the global exposure and to suppress a leakage signal suppression ratio for each of the RGB pixels. Accordingly, in the imaging apparatus 300 such as a video camera, a digital still camera, or a camera module for a mobile apparatus such a mobile phone, it is possible to obtain a high image quality in a captured image.

In addition, in the aforementioned embodiments, the description is made with respect to the case where the invention is adapted to the CMOS image sensor where the unit pixels of detecting the signal charges according to the light amount of visible light as a physical quantity are arrayed in a matrix shape. However, the invention is not limited to the adaptation to the CMOS image sensor, but the invention may be adapted to overall column type solid-state imaging devices where a column processing unit is disposed for each pixel column of the pixel array unit.

In addition, the invention is not limited to the adaptation to the solid-state imaging device which detects a distribution of incident light amount of visible light and captures it as an image. The invention may be adapted to overall solid-state imaging devices, for example, a solid-state imaging device which detects a distribution of an incident amount of infrared light, X rays, or particles and captures it as an image or a wide-meaning solid-state imaging device (physical quantity distribution detection apparatus) such as a fingerprint detection sensor which detects a distribution of other physical quantities such as pressure or electrostatic capacitance and captures it as an image.

The present application contains subject matter related to that disclosed in Japanese Priority Patent Application JP 2010-089606 filed in the Japan Patent Office on Apr. 8, 2010, the entire contents of which are hereby incorporated by reference.

In addition, the embodiments of the invention are not limited to the aforementioned embodiments, but various modifications may occur without departing from the spirit of the invention.

What is claimed is:

1. A solid-state imaging device comprising:
a first conductivity type substrate;
a second conductivity type well at a surface side of the first conductivity type substrate;
a photoelectric conversion area in the second conductivity type well to convert incident light to charges;
a first conductivity type charge retaining area in the second conductivity type well to retain the charges output from the photoelectric conversion area until the charges are read out, the first conductivity type charge retaining area being separate from the photoelectric conversion area;
a charge voltage conversion area in the second conductivity type well to convert the charges retained in the charge retaining area to a voltage; and
a first conductivity type layer area that is separate from the photoelectric conversion area and the first conductivity type charge retaining area, the first conductivity type layer area being configured as a first conductivity type region having a convex shape such that the first conductivity type region protrudes from a boundary between the first conductivity type substrate and the second conductivity type well to a predetermined position under at least a portion of the first conductivity type charge retaining area,
wherein,
the first conductivity type layer area is provided as a portion of the first conductivity type substrate that protrudes upwards under at least the portion of the first conductivity type charge retaining area and has a lower concentration of a first conductivity type impurity than the first conductivity type substrate.

2. An electronic apparatus comprising:
a solid-state imaging device, the solid-state imaging device including an array of unit pixels, each unit pixel including:
a first conductivity type substrate,
a second conductivity type well at a surface side of the first conductivity type substrate,
a photoelectric conversion area in the second conductivity type well to convert incident light to charges,
a first conductivity type charge retaining area in the second conductivity type well to retain the charges output from the photoelectric conversion area until the charges are read out, the first conductivity type charge retaining area being separate from the photoelectric conversion area,
a charge voltage conversion area in the second conductivity type well to convert the charges retained in the charge retaining area to a voltage, and
a first conductivity type layer area that is separate from the photoelectric conversion area and the first conductivity type charge retaining area, the first conductivity type layer area being configured as a first conductivity type region having a convex shape such that the first conductivity type region protrudes from a boundary between the first conductivity type substrate and the second conductivity type well to a predetermined position under at least a portion of the first conductivity type charge retaining area,
wherein,
the solid-state device is configured such that charge accumulation is simultaneously performed for all of the unit pixels in the array,
each unit pixel further includes a transfer gate that transfers the charges accumulated in the photoelectric conversion area to the charge retaining area that retains the charges until the charges are read out, and
the first conductivity type layer area in each unit pixel is provided as a portion of the first conductivity type substrate that protrudes upwards under at least the portion of the first conductivity type charge retaining area and has a lower concentration of a first conductivity type impurity than the first conductivity type substrate.

3. A solid-state imaging device comprising:
a first conductivity type substrate;
a second conductivity type well at a surface side of the first conductivity type substrate;
a photoelectric conversion area in the second conductivity type well to convert incident light to charges;
a first conductivity type charge retaining area in the second conductivity type well to retain the charges output from the photoelectric conversion area until the charges are read out, the first conductivity type charge retaining area being separate from the photoelectric conversion area;
a charge voltage conversion area in the second conductivity type well to convert the charges converted by the photoelectric conversion area to a voltage; and
a first conductivity type layer area separate from the photoelectric conversion area and the first conductivity type charge retaining area, the first conductivity type layer area being configured as a first conductivity type region having a convex shape such that the first conductivity type region protrudes from a boundary between the first conductivity type substrate and the second conductivity type well to a predetermined position under at least a portion of the charge voltage conversion area,
wherein,
the first conductivity type layer area is provided as a portion of the first conductivity type substrate that protrudes upwards under at least the portion of the charge voltage conversion area and has a lower concentration of a first conductivity type impurity than the first conductivity type substrate.

4. An electronic apparatus comprising:
a solid-state imaging device, the solid-state imaging device including an array of unit pixels, each pixel including:
a first conductivity type substrate,
a second conductivity type well at a surface side of the first conductivity type substrate,
a photoelectric conversion area in the second conductivity type well to convert incident light to charges,
a first conductivity type charge retaining area in the second conductivity type well to retain the charges output from the photoelectric conversion area until the charges are read out, the first conductivity type charge retaining area being separate from the photoelectric conversion area,
a charge voltage conversion area in the second conductivity type well to convert the charges converted by the photoelectric conversion area to a voltage, and
a first conductivity type layer area separate from the photoelectric conversion area and the first conductivity type charge retaining area, the first conductivity type layer area being configured as a first conductivity type region having a convex shape such that the first conductivity type region protrudes from a boundary between the first conductivity type substrate and the second conductivity type well to a predetermined position under at least a portion of the charge voltage conversion area,
wherein,
the solid-state device is configured such that charge accumulation is simultaneously performed for all of the unit pixels in the array,
each unit pixel further includes a transfer gate that transfers the charges accumulated in the photoelectric conversion area to the charge retaining area that retains the charges until the charges are read out, and
the first conductivity type layer area in each unit pixel is provided as a portion of the first conductivity type substrate that protrudes upwards under at least the portion of the charge voltage conversion area and has a lower concentration of a first conductivity type impurity than the first conductivity type substrate.

* * * * *